United States Patent

Yoshimura et al.

[11] Patent Number: 5,835,646
[45] Date of Patent: Nov. 10, 1998

[54] ACTIVE OPTICAL CIRCUIT SHEET OR ACTIVE OPTICAL CIRCUIT BOARD, ACTIVE OPTICAL CONNECTOR AND OPTICAL MCM, PROCESS FOR FABRICATING OPTICAL WAVEGUIDE, AND DEVICES OBTAINED THEREBY

[75] Inventors: Tetsuzo Yoshimura; Wataru Sotoyama; Takeshi Ishitsuka; Koji Tsukamoto; Shigenori Aoki; Satoshi Tatsuura; Katsusada Motoyoshi; Yasuhiro Yoneda, all of Kawasaki, Japan

[73] Assignee: Fujitsu Limited, Kanagawa, Japan

[21] Appl. No.: 694,583

[22] Filed: Aug. 9, 1996

[30] Foreign Application Priority Data

Sep. 19, 1995 [JP] Japan .................................. 7-239782
Sep. 20, 1995 [JP] Japan .................................. 7-241924
Sep. 29, 1995 [JP] Japan .................................. 7-253833

[51] Int. Cl.$^6$ ...................................................... G02B 6/26
[52] U.S. Cl. ............................ 385/14; 385/134; 385/49; 385/45; 385/88; 385/89; 385/83; 385/24; 385/43; 385/37; 385/28
[58] Field of Search ................................ 385/14, 88, 89, 385/90, 91, 92, 93, 94, 49, 134, 45, 83, 24, 43, 37, 28

[56] References Cited

U.S. PATENT DOCUMENTS

| | | | |
|---|---|---|---|
| 5,521,992 | 5/1996 | Chun et al. | 385/14 |
| 5,546,489 | 8/1996 | Saski et al. | 385/88 |
| 5,550,941 | 8/1996 | Lebby et al. | 385/49 |
| 5,625,734 | 4/1997 | Thomas et al. | 385/88 |

*Primary Examiner*—John Ngo
*Attorney, Agent, or Firm*—Armstrong, Westerman, Hattori, McLeland & Naughton

[57] ABSTRACT

An active optical circuit sheet or active optical circuit board wherein an electro optical switch or optical modulator is driven with a voltage (SIGin) from an electronic device, the electrical signal (SIGin) is converted to an optical signal, transmitted and then converted to an electrical signal (SIGout) at an optical receiver element, and an electrical connection is formed between an optical wiring board and the electronic device for transmission of signals to another or the same electronic device, separating the electrical wiring at the electronic device end and the optical wiring at the optical wiring board end, or alternatively, SIGin and SIGout electrode pads are provided on the side of the optical wiring board on which the optical device is mounted or on the opposite side, for connection with the electronic device.

9 Claims, 32 Drawing Sheets

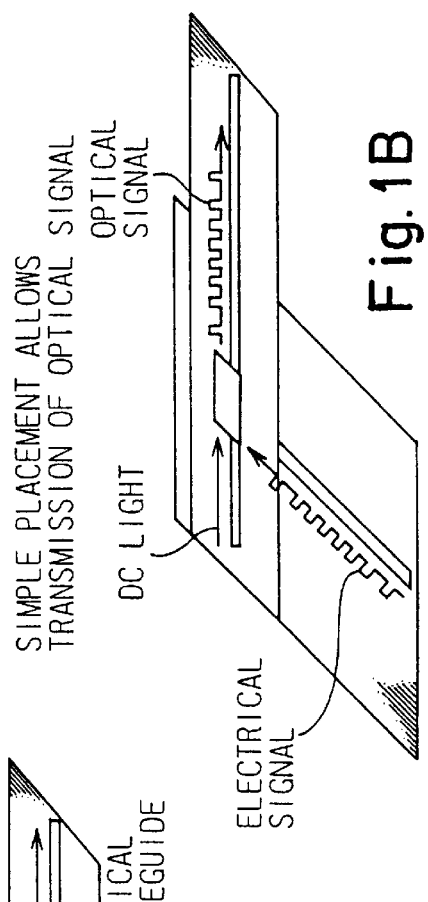
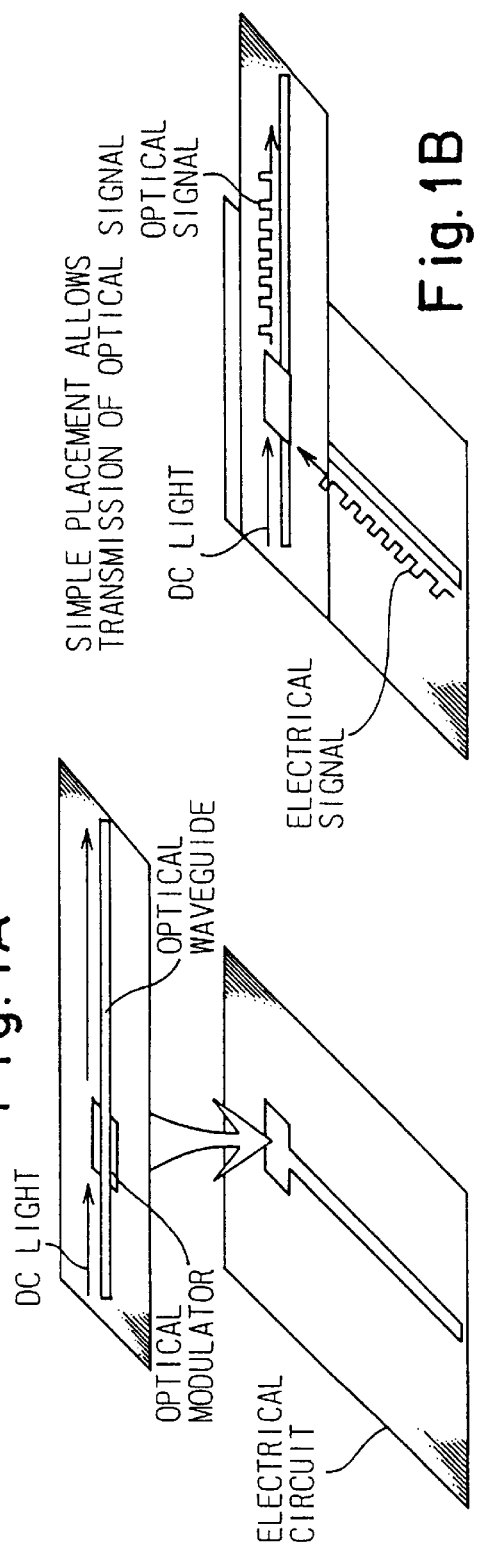
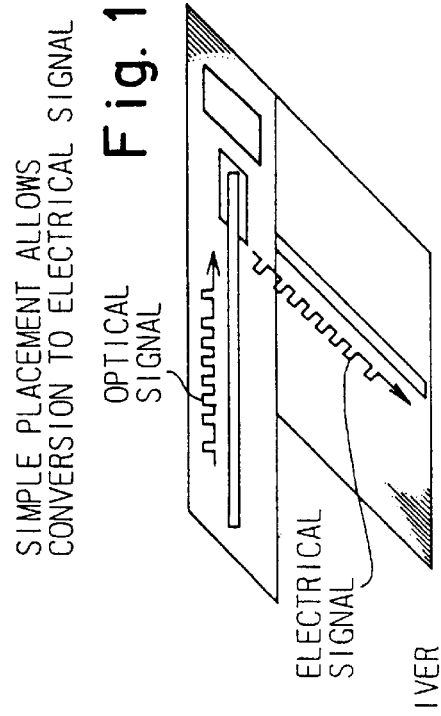
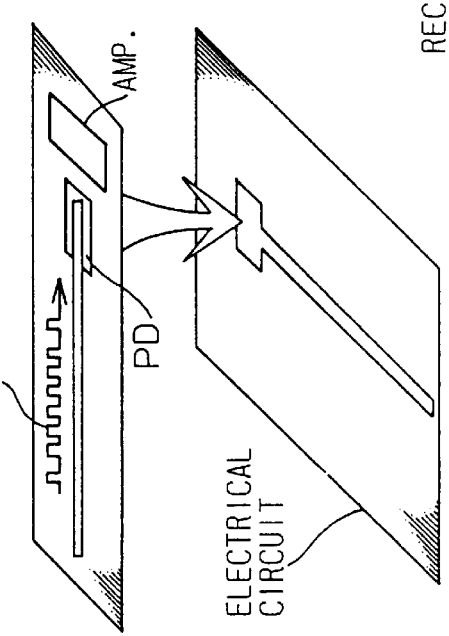

TRANSMITTER

RECEIVER

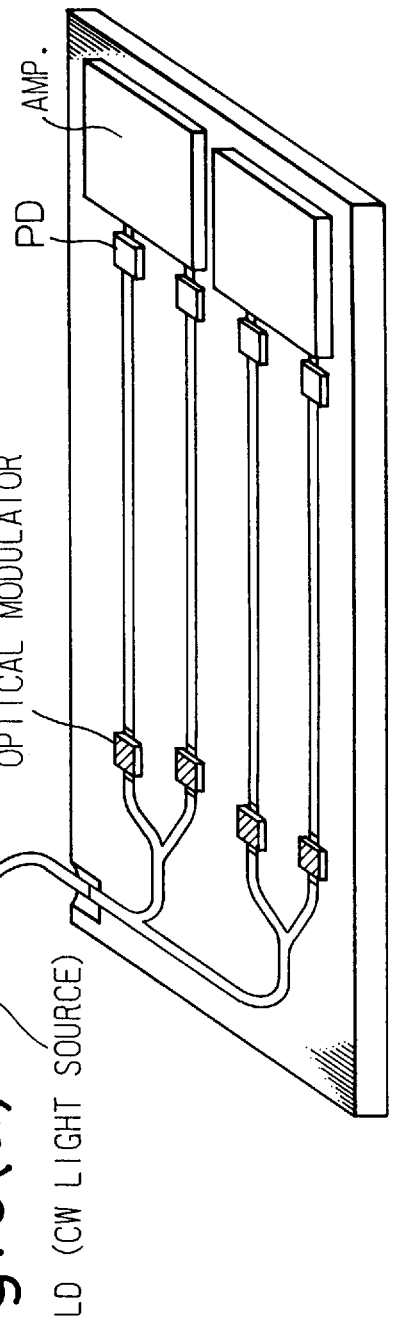
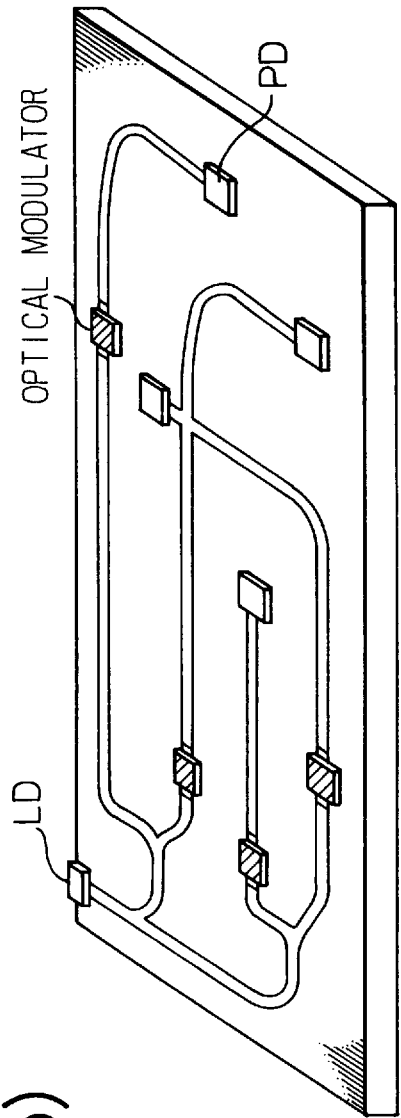
Fig.6(a)
Fig.6(b)

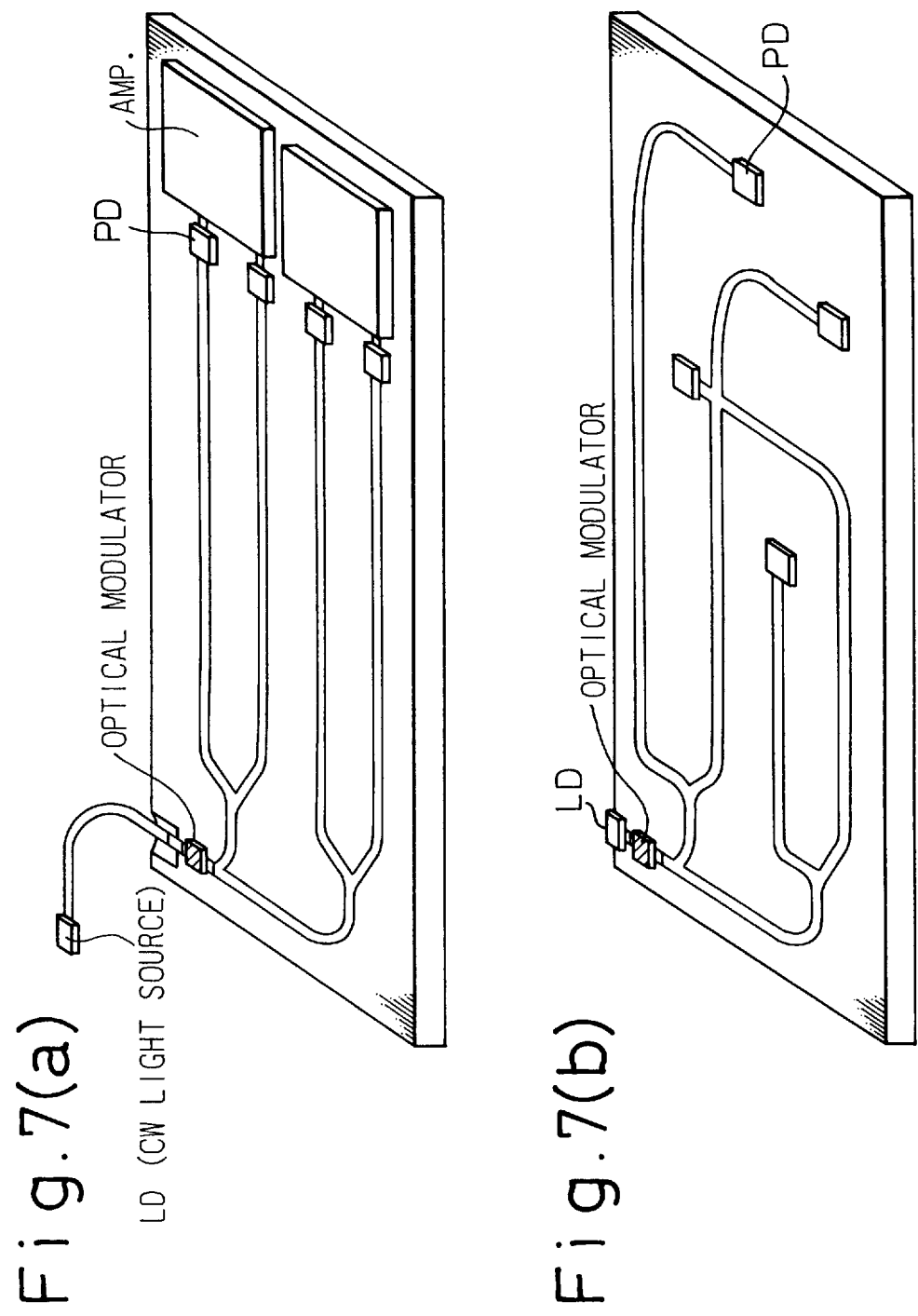

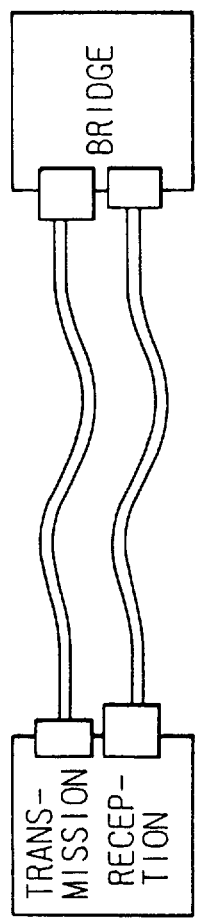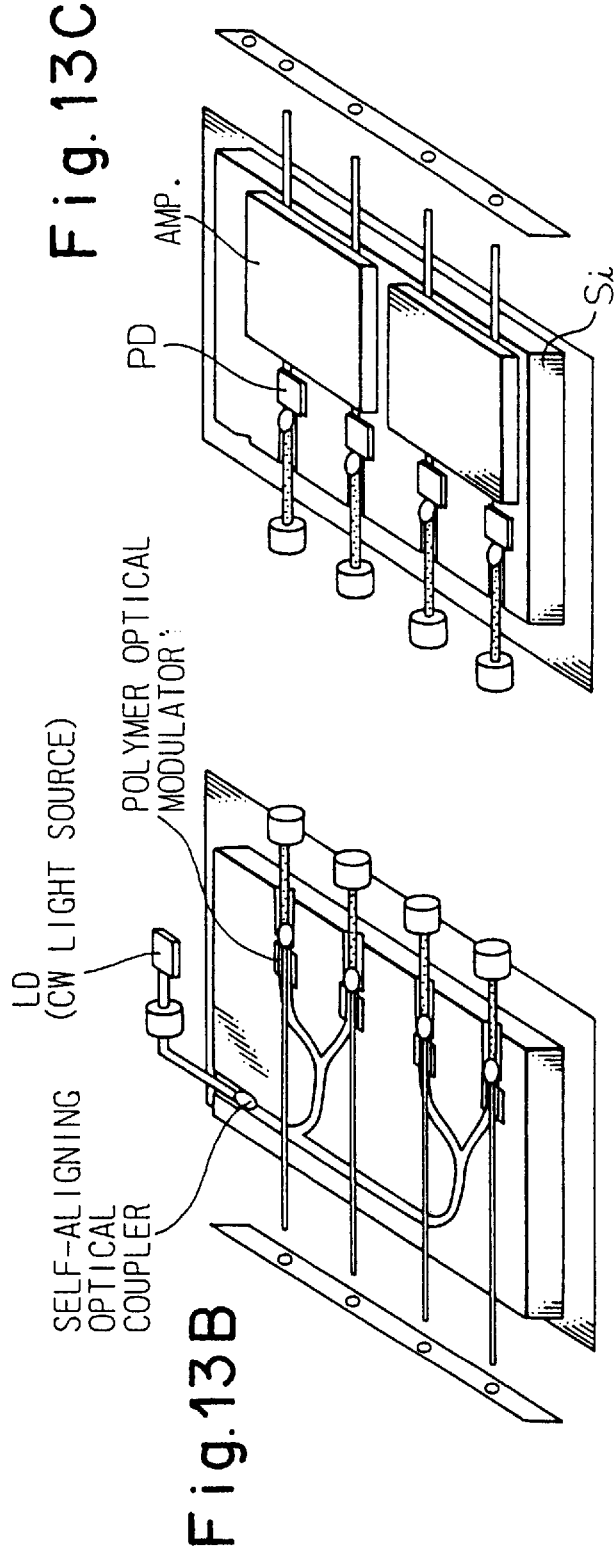

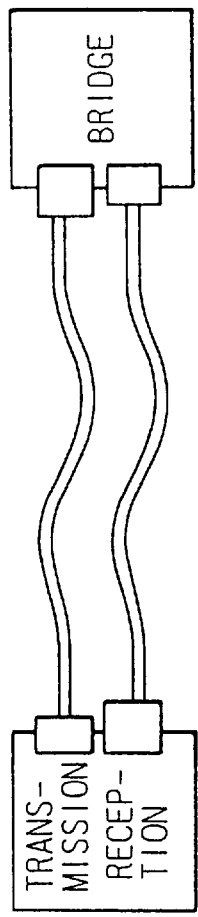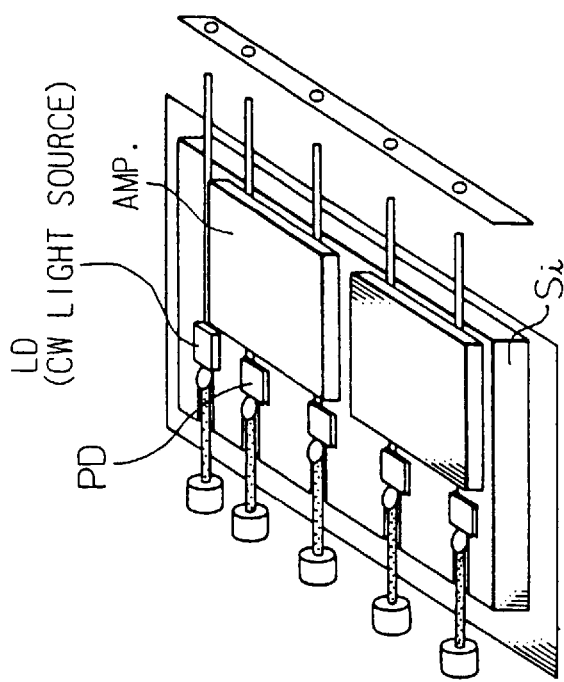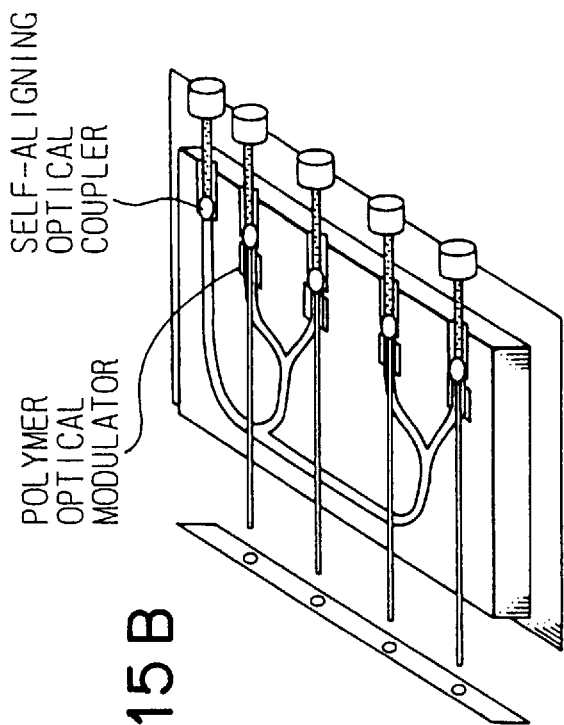

OPTICAL TRANSMISSION BY PLUGGING IN ELECTRICAL CONNECTOR
CLOCK RATE: A FEW 100 MHz

Fig. 18B
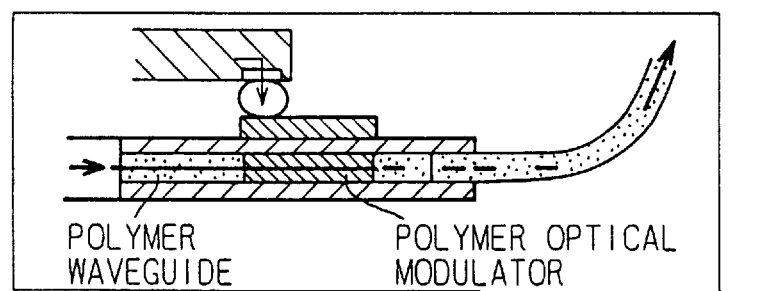
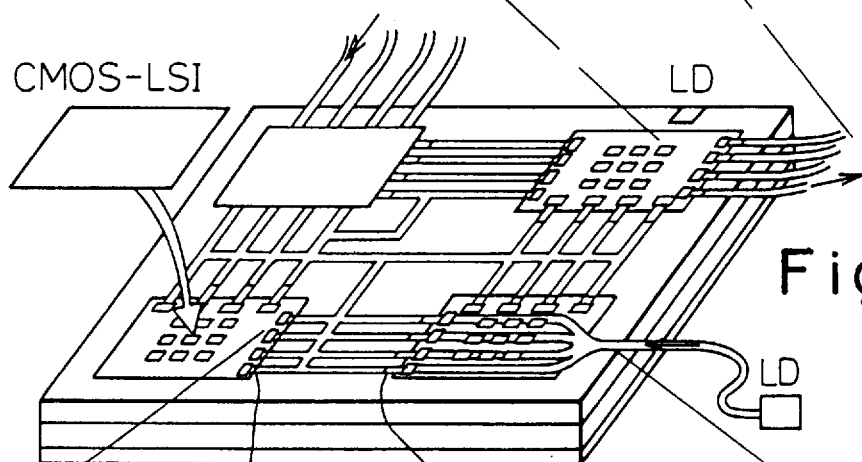
Fig. 18A
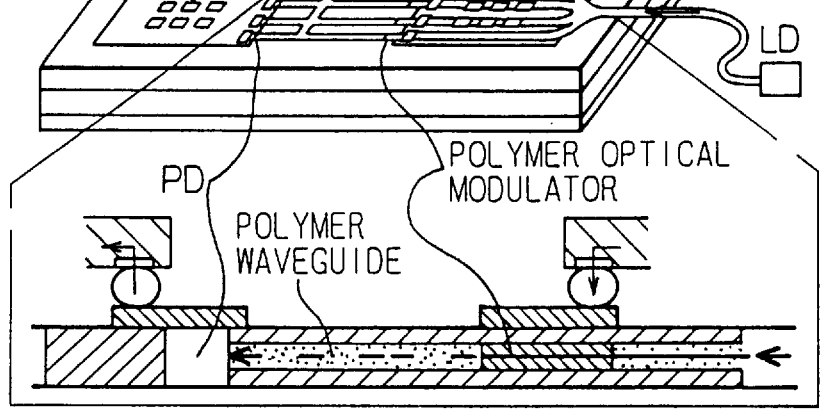
Fig. 18C

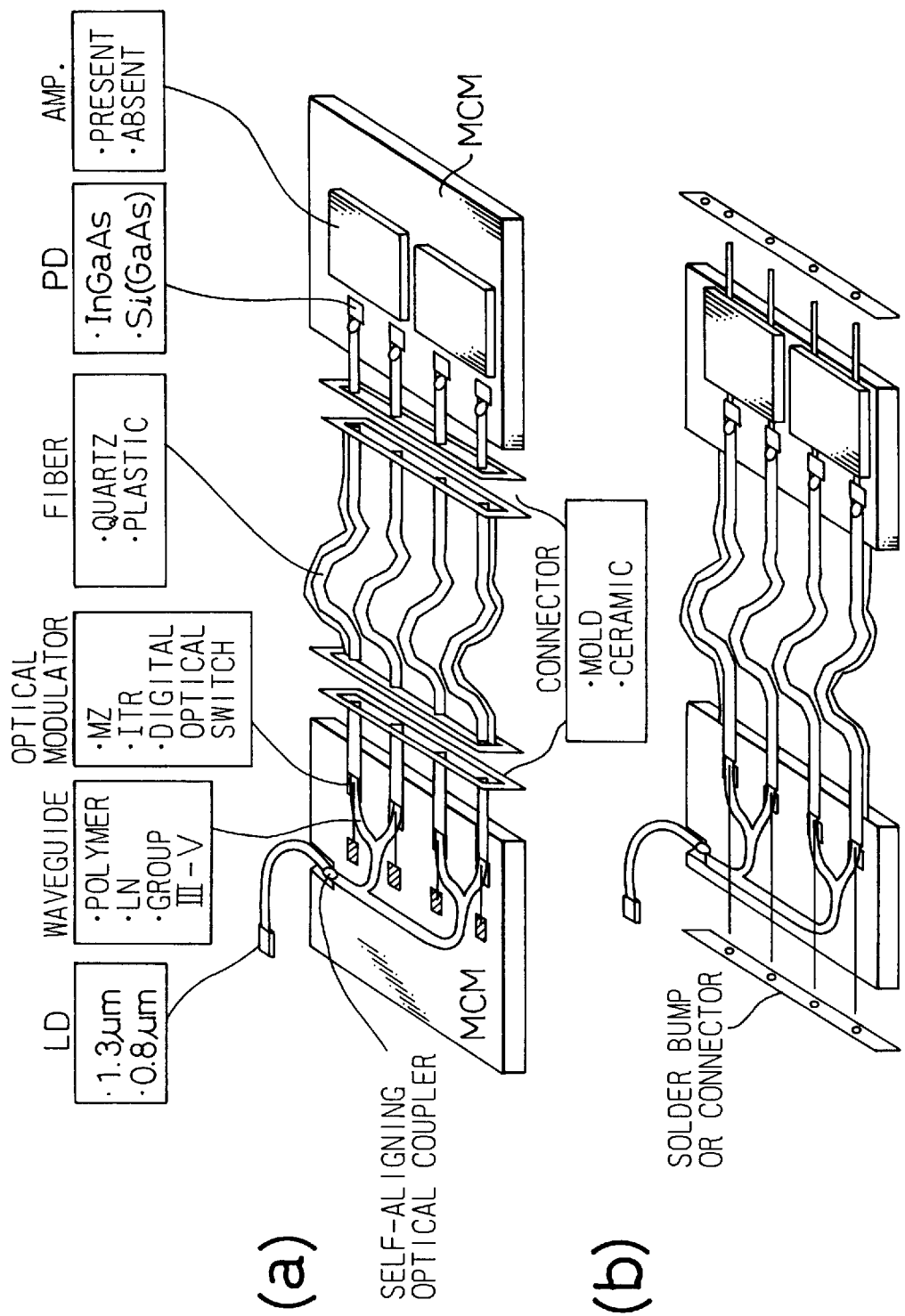

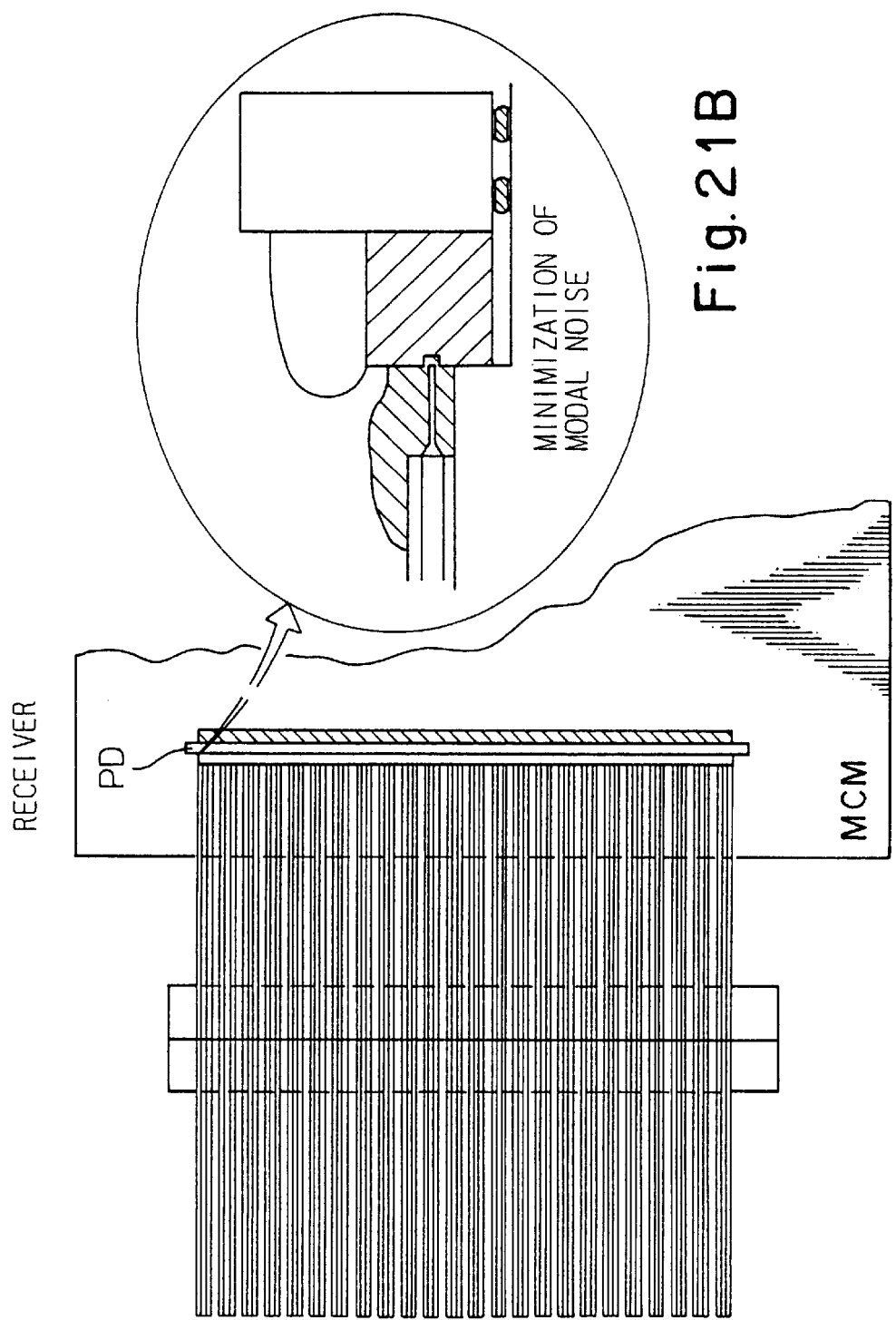

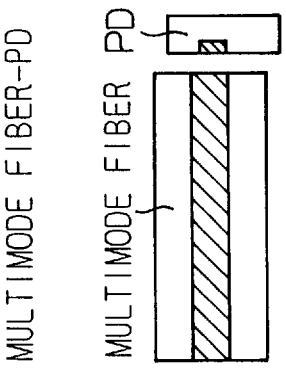
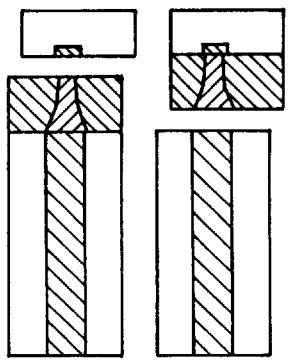
Fig.24(c)
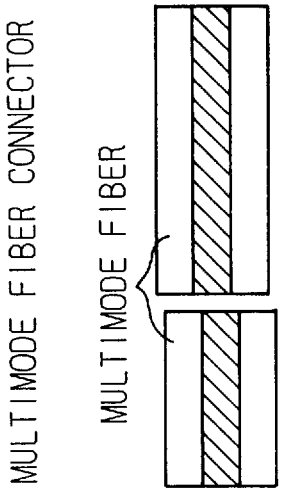
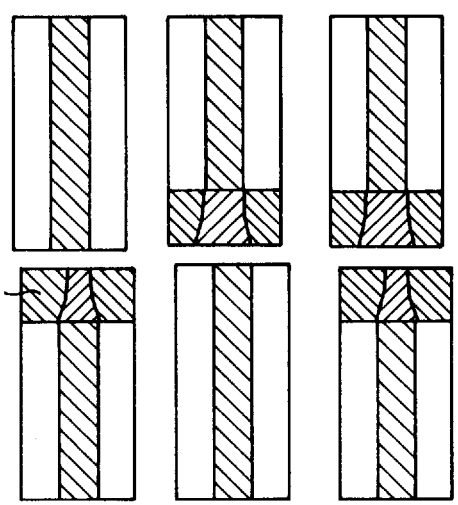
Fig.24(b)
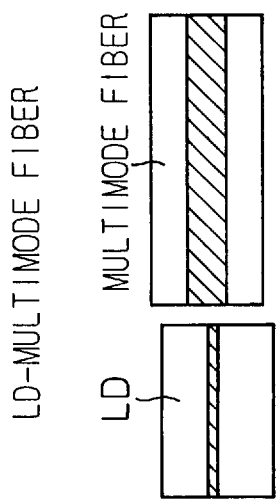
Fig.24(a)

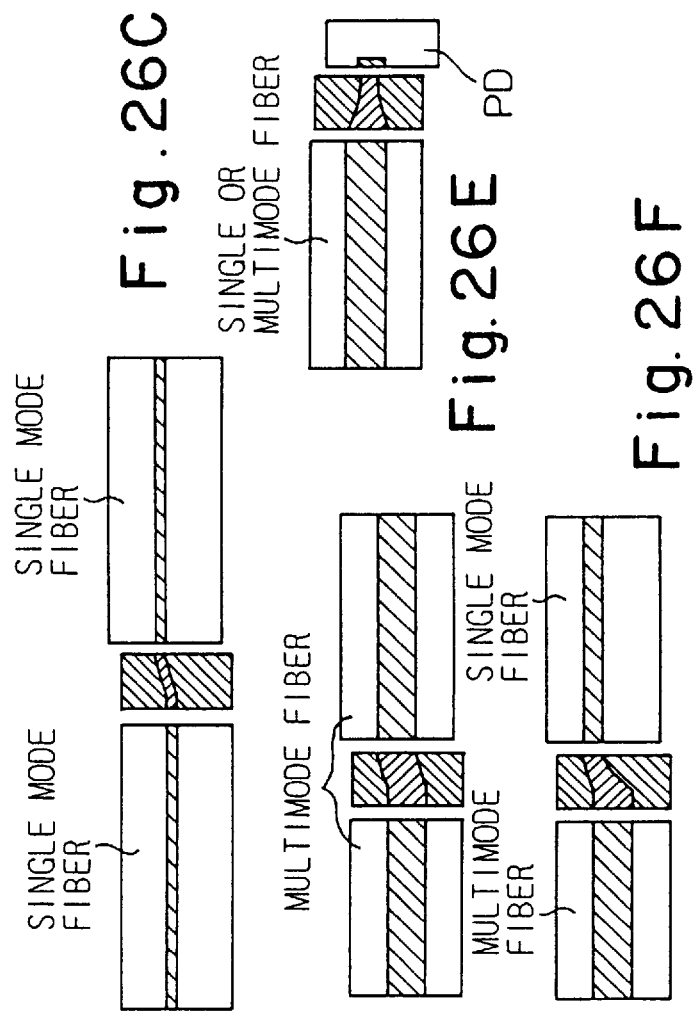
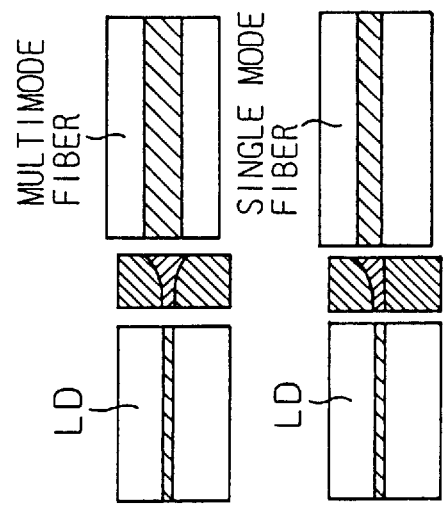

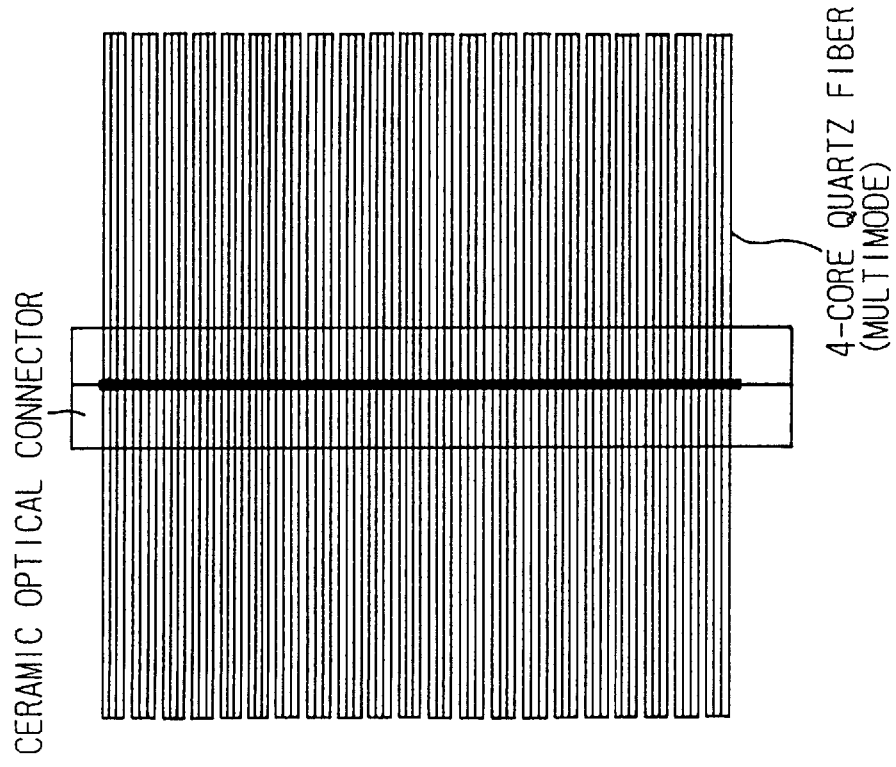
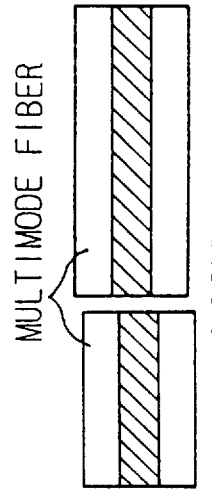
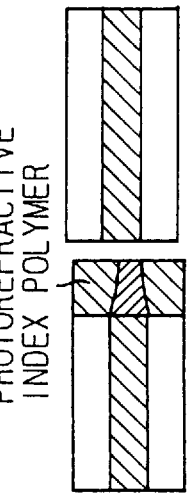
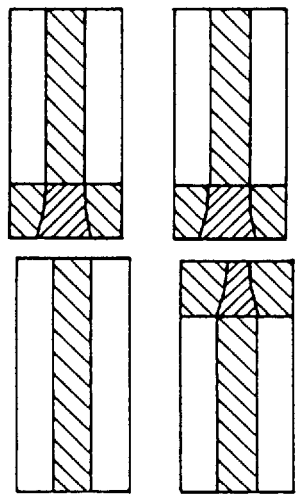
Fig. 27A
Fig. 27B
Fig. 27C
Fig. 27D
Fig. 27E
CERAMIC OPTICAL CONNECTOR
4-CORE QUARTZ FIBER (MULTIMODE)
MULTIMODE FIBER
PHOTOREFRACTIVE INDEX POLYMER
COUPLER MAGNIFIED

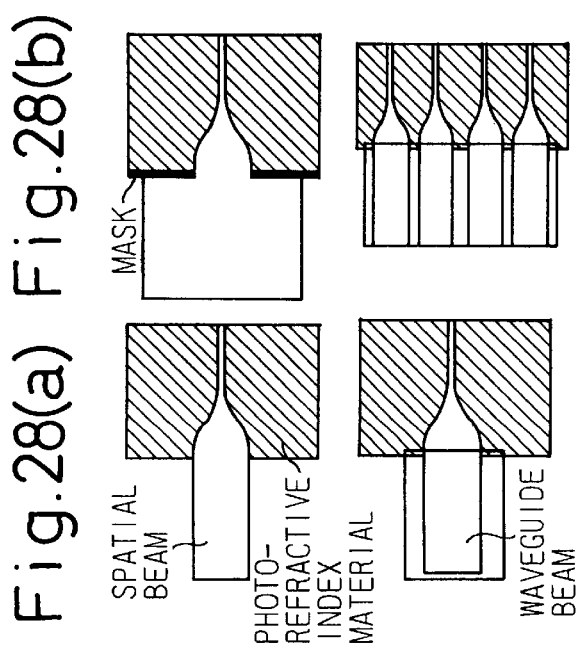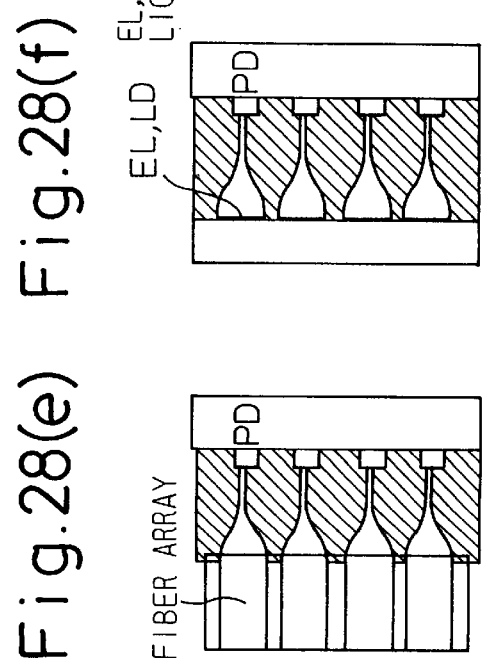

OPTICAL KEY

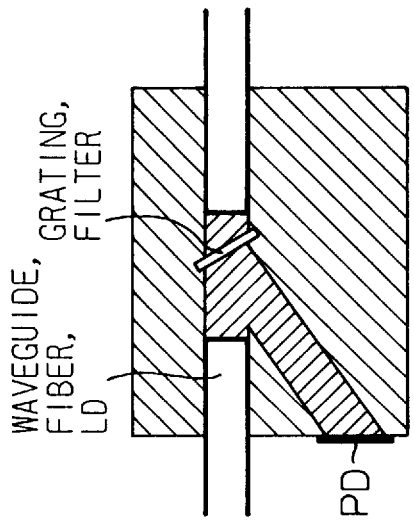
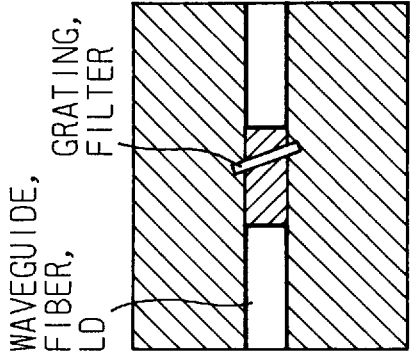
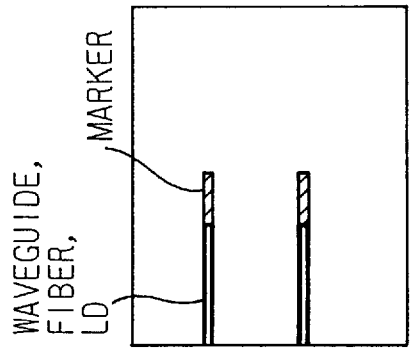

WAVEGUIDE, FIBER, LD

GRATING, FILTER

FILTER OR OTHER OPTICAL DEVICE

ACTIVE OPTICAL CIRCUIT SHEET OR ACTIVE OPTICAL CIRCUIT BOARD, ACTIVE OPTICAL CONNECTOR AND OPTICAL MCM, PROCESS FOR FABRICATING OPTICAL WAVEGUIDE, AND DEVICES OBTAINED THEREBY

BACKGROUND OF THE INVENTION

1. Field of the Invention

The present invention relates to active optical circuit sheets and active optical circuit boards.

The present invention also relates to active optical connectors and optical MCMs. It further relates to wavelength multiplex active optical connectors and wavelength multiplex optical MCMs.

The present invention further relates to a process for fabricating optical waveguides and to devices obtained thereby.

2. Description of the Related Art

The increasing speed and miniaturization of LSIs has created serious problems which include wiring delays, heat buildup and generation of EMI within and between such electronic devices as IC boards, MCMs, back planes, LSIs, personal computers, workstations, computers, peripheral devices, terminals and the like. In light of this situation, many attempts have been made to introduce optical wiring into electronic devices.

The major optical wiring system employed is a direct modulation system wherein an LD or other light-emitting device is switched on and off; problems remain, however, in the high cost of LD arrays, the need for driving LSIs, the occurrence of skews, and the difficulty of optical axis alignment. Nevertheless, it is possible to achieve improvements over the above-mentioned problems by applying an external modulation system using an electrooptical modulator. Also, since the driving current for the optical modulator is smaller than that of the LD (because the optical modulator is voltage-driven), the EMI radiation may be further reduced. In light of this, a number of external modulation system LSI-connecting optical printed circuit boards have been proposed (for example, Fujitsu: Japanese Unexamined Patent Publication No. 63-229427, IBM: U.S. Pat. No. 4,422,088, Lockheed: U.S. Pat. No. 5,039,189 and GEC-Marconi: GB2240682A). However, because all of these have the electric wiring and optical wiring formed on a single board, the following problems arise, namely:

The production process for the circuit board becomes more complicated,

The cost is increased,

The wiring freedom is restricted, and

The soldering connection process for the LSI produces defects in the electrooptical modulator.

In addition, since, according to the prior art described above, the modulator array is formed directly under or near the LSI output terminal, the locations for optical signal generation are limited.

For optical wiring between electronic devices, there have been proposed optical wiring I/O adaptors also based on an external modulation system (Japanese Unexamined Patent Publication No. 63-229427). The aforementioned problems do not exist in this case, but even more freedom in optical wiring would be expected by realizing optical wiring which can be used both within and between electronic devices.

Furthermore, with conventional active optical connectors and optical MCMs, wherein light from a light source is modulated by electrical output from an electronic device, circuit board, LSI or other electronic apparatuses to convert the outputted electrical signal to an optical signal which is then transmitted, and which are mounted onto the electronic devices, the light-emitting light source and the light incident section have become obstacles.

In addition, conventional optical multiplex wiring between electronic devices has required that each device be equipped with a wavelength-variable light source or multiple light sources with different wavelengths.

Moreover, the fields of data processing and communication have seen dramatic progress in the area of optical wiring, and the diffusion of optical technology such as optical parallel processors and "fiber to the home" is expected to continue in the future. Light-employing information-related devices, such as optical disks, POS systems, optical printers, image sensors, displays and the like are also becoming more common. Such devices are expected to require high performance, downsizing, lower cost and lower power consumption, while a variety of different types of optical-related apparatuses and devices will be developed. In light of these circumstances, as the need increases for various optical integrated circuits, including optical waveguide devices, and light control techniques as well, easy and efficient optical coupling between different optical devices such as optical fibers will become imperative.

However, this field of technology must deal with the following problems.

(1) Known etching methods for forming waveguides have had low positioning precision and freedom of shape.

(2) Though positioning precision has been attempted with the V-groove method, adequate performance has not yet been realized.

(3) Optical connector loss and modal noise in multimode systems have been problems.

(4) Optical elements sometimes cannot be easily detached.

(5) Labor has been required for alignment of beams and lenses when employing lens arrays for adjusting waveguide beams and spatial beams for shape variation.

(6) There has been no method allowing easy reconstruction of light which varies in diameter in the axial direction (e.g. to approach a circle).

(7) There has been no method for automatically and readily forming the optical paths of optical wiring.

(8) With optical printers, there has been no method for automatically and readily forming optical paths guiding light to photosensitive drums.

(9) With image-reading devices, there has been no method for automatically and readily forming optical paths coupling the light sources, the objects to be read and the PDs.

(10) With TFT-driven liquid crystal displays, there has been no method for automatically guiding light to TFT openings.

(11) No keys have been provided which are recognized by waveguide orientation.

(12) There has been no method for forming a marker with light emitted from the waveguide end after formation of the waveguide.

(13) There has been no method for easily inserting optical devices midway through waveguides.

SUMMARY OF THE INVENTION

It is an object of the present invention to overcome the aforementioned problems of external modulation system optical wiring, by providing an active optical circuit sheet and active optical circuit board wherein the optical wiring section is separate and independent of the optical/electrical hybrid board, and the optical wiring section and electrical wiring section can be very freely and easily incorporated.

In particular, the object of the present invention is to provide an active optical circuit sheet and active optical circuit board having a construction which allows optical signals to be generated by probing especially at desired locations of voltage generation on pads, terminals, wiring, etc. of electronic devices.

It is another object of the present invention to eliminate mounting obstacles for active optical connectors or optical MCMs caused by the presence of light sources or light incidence sections.

It is yet another object of the present invention to eliminate the need for orienting wavelength-variable light sources or multiple light sources of different wavelengths in different electronic devices of wavelength multiplex active optical connectors or wavelength multiplex optical MCMs.

Another of the aims of the present invention is that of overcoming the aforementioned problems (1) through (13) by using photorefractive index materials and employing a light self-focusing effect, in order to realize optical integrated circuits and optical control techniques through simple and highly efficient optical coupling between optical devices.

In order to achieve the objects, the present invention provides an active optical circuit sheet or active optical circuit board as an optical circuit board wherein an electrooptical switch or optical modulator built on a board is driven with a voltage (SIGin) from an electronic device (an IC board, MCM, back plane, LSI, personal computer, workstation, computer, peripheral device, terminal or the like), the electrical signal (SIGin) is converted to an optical signal by pick-up or modulation of at least a portion of the light from a waveguide or light source on the board, the optical signal is transmitted through a waveguide and/or optical fibers and converted to an electrical signal (SIGout) by a photoreceptor element built into or mounted on said board or another board, or a photoreceptor element provided on an LSI, and the signal is transmitted to another electronic device or the same electronic device, characterized in that an electrical connection is formed between the optical wiring board and the electronic device, separating the electrical wiring at the electronic device end and the optical wiring at the optical wiring board end, or SIGin and SIGout electrode pads are also provided on the side of the optical wiring board on which the optical device is mounted or the opposite side, for connection with the electronic device.

The present invention further provides an active optical connector or optical MCM which modulates light from a light source based on electrical output from an electrical apparatus such as an electronic device, circuit board or LSI, converts the outputted electrical signal to an optical signal and optically transmits it, characterized in that light is directed incident to the active optical connector or optical MCM at an angle which is not parallel to the optically transmitted output, or in the direction opposite to the optically transmitted output.

The present invention further provides an active optical connector or optical MCM which modulates light from a light source based on electrical output from an electrical apparatus such as an electronic device, circuit board or LSI, and converts and optically transmits the outputted electrical signal as an optical signal, characterized in that light is supplied from a unit at the optical signal receiving end.

The present invention further provides a wavelength multiplex active optical connector or wavelength multiplex optical MCM characterized in that light of different wavelengths is supplied, and switching of the different light is performed with a matrix optical switch or matrix optical filter to supply light of given wavelengths to optical modulators corresponding to given electronic devices.

The present invention further provides an optical connector comprising optical coupling paths in either or both directions between optical devices, formed by situating a photorefractive index material between all or some of a plurality of optical devices and irradiating light from one or more of the optical devices to create a refractive index distribution in the optical photorefractive index material, characterized in that at least one of the plurality of optical devices is detachable.

The present invention further provides a process for fabricating an optical waveguide, characterized by directing spatial propagated light, waveguide light or radiated light on a photorefractive index material to form a refractive index distribution while producing a self-focusing effect.

The present invention further provides, optical wiring characterized in that radiated light from a device selected from optical fibers, optical waveguides, semiconductor lasers, light-emitting diodes, EL elements, spatial optical modulator elements, lenses, holograms, prisms, gratings, mirrors, pinholes, slits and filters, and arrays thereof, is directed incident to a photorefractive index material either connected to or spaced from the device to form a refractive index distribution, while producing a self-focusing effect, and the terminal thereof is formed by connection to or spacing from a photodiode array;

an optical printer characterized in that radiated light from a device selected from optical fibers, optical waveguides, semiconductor lasers, light-emitting diodes, EL elements, spatial optical modulator elements, lenses, holograms, prisms, gratings, mirrors, pinholes, slits and filters, and arrays thereof, is directed incident to a photorefractive index material either connected to or spaced from the device, while producing a self-focusing effect, to form a waveguide with a diameter smaller or equal to the incident end, and the terminal thereof is formed by connection to or spacing from a photosensitive drum or photosensor;

an image reading device characterized in that radiated light from a device selected from optical fibers, optical waveguides, semiconductor lasers, light-emitting diodes, EL elements, spatial optical modulator elements, lenses, holograms, prisms, gratings, mirrors, pinholes, slits and filters, and arrays thereof, is directed incident to a photorefractive index material either connected to or spaced from the device, while producing a self-focusing effect, and the light is reflected with a light reflector positioned near the edge to form a bent waveguide with a diameter smaller or equal to the incident end, wherein the terminal thereof is formed by connection to or spacing from a photodiode PD;

an LCD display characterized in that a photorefractive index material is positioned on a TFT-formed board or a board facing it in a TFT-driven liquid crystal display, light is irradiated from the side of the board on which the TFT is formed, and a refractive index distribution is formed in the photorefractive index material by light passing through an opening;

an optical key characterized in that radiated light from a device selected from optical fibers, optical waveguides, semiconductor lasers, light-emitting diodes, EL elements, spatial optical modulator elements, lenses, holograms, prisms, gratings, mirrors, pinholes, slits and filters, and arrays thereof, is directed incident to a photorefractive index material either connected to or spaced from the device, while producing a self-focusing effect, to form a waveguide with a smaller or equal diameter as the incident end, and the terminal thereof is formed by connection to or spacing from a photodiode array, wherein at least one break is provided along the optical wiring;

a process for forming a marker, characterized in that a photorefractive index material is positioned on a region including an edge of a formed waveguide, and a marker is formed by light emitted from the waveguide;

a process for fabricating an optical circuit device, characterized in that a plurality of optical devices are formed or positioned, before, during or after which other optical devices are formed along the optical path between them, before, during or after which a photorefractive index material is positioned and light is emitted from at least one of the optical devices to form a waveguide; and a process for fabricating an optical circuit device, characterized in that one optical device is formed or positioned, before, during or after which another optical device is formed, before, during or after which a photorefractive index material is positioned and light is emitted from at least one of the optical devices to form a waveguide.

The photorefractive index material refers to a material that changes its refractive index or solubility by light exposure.

BRIEF DESCRIPTION OF THE DRAWINGS

FIGS. 1(a)–1(d) are conceptual drawings of light transmission according to the invention.

FIGS. 6(a) and 6(b) are illustrations of embodiments of active optical circuit sheets or boards.

FIGS. 7(a) and 7(b) are illustrations of other embodiments of active optical circuit sheets or boards.

FIGS. 13(a)–13(c) are schematic views of an embodiment of an active optical connector for an optical parallel link module.

FIGS. 15(a)–15(c) are schematic views of another embodiment of an active optical connector for an optical parallel link module.

FIG. 18(a)–18(c) are schematic views of an embodiment of an optical MCM/back plane.

FIGS. 19(a) and 19(b) are drawings of embodiments of materials for optical MCMs and active optical connectors, etc.

FIGS. 21(a) and 21(b) are schematic drawings showing the detailed structure of the receiver section of the apparatus in FIG. 19.

FIGS. 24(a), 24(b) and 24(c) are schematic drawings of embodiments of optical fiber connectors.

FIGS. 26(a) to 26(f) are schematic drawings of various embodiments of optical connectors.

FIGS. 27(a) to 27(e) are schematic drawings showing an embodiment of the detailed structure of the connector section between multimode fibers.

FIGS. 28(a), 28(b), 28(c), 28(d), 28(e), 28(f), 28(g) and 28(h) are schematic drawings of embodiments employing optical waveguides obtained by directing spatial propagated light, waveguide light or radiated light incident to a photorefractive index material to form a refractive index distribution.

FIGS. 31(a), 31(b) and 31(c) are schematic views illustrating a process for fabricating an optical circuit device.

DESCRIPTION OF THE PREFERRED EMBODIMENTS

Preferred embodiments of the present invention will now be explained with reference to the attached drawings.

Figure 2A:
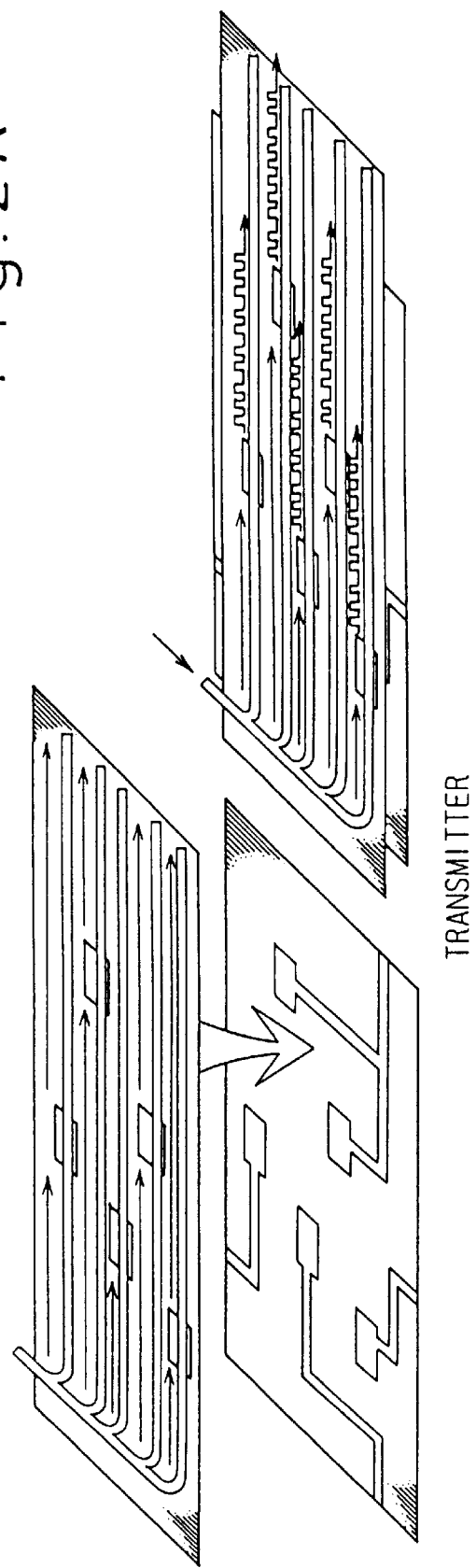
FIGS. 2(a) and 2(b) are conceptual drawings of light transmission according to the invention.
Figure 2B:
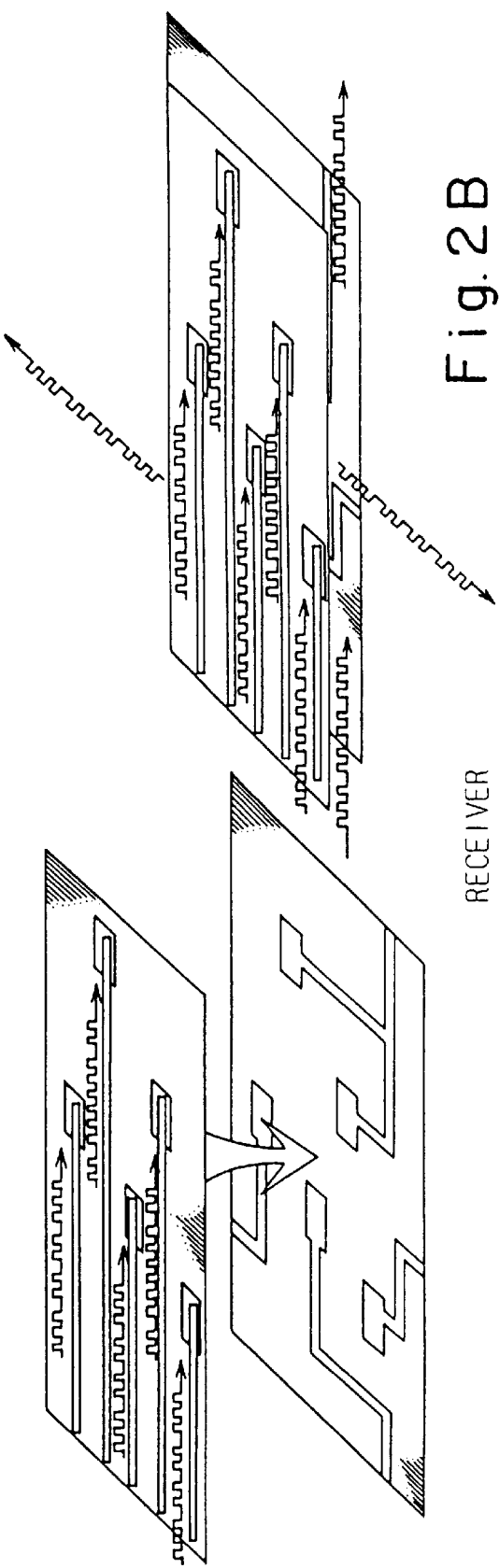

FIGS. 1(a) to 2(b) are conceptual drawings of light transmission according to the invention. FIGS. 1(a)–1(d) show a single channel case, and FIGS. 2(a) and 2(b) show a multichannel case. By contacting the electrode of an optical modulator with the electrode of an electrical circuit board, an optical signal is transmitted by the electrical output signals from the electrical circuit board. The optical signal is converted by PD into an electrical signal, and the signal is input to the electrical circuit board. Thus, very simple optical connections become available.

Figure 3:
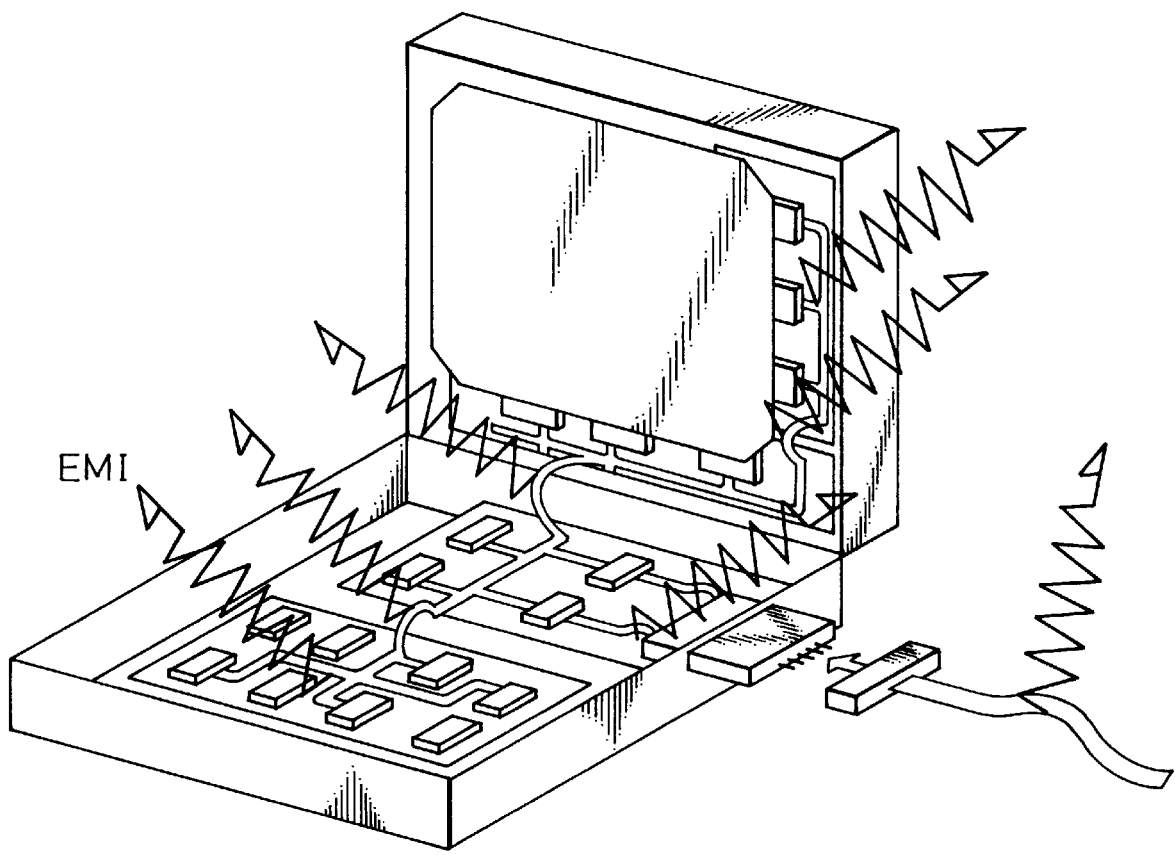
FIG. 3 is a schematic view of an embodiment of conventional electrical wiring of a personal computer.

FIG. 3 is a schematic view of conventional electrical wiring using a personal computer as an example. Such devices require high speed and low power, particularly in long wiring for printed circuit board clocks, LCD-driving printed circuit boards, printed circuit board wiring, interface cables, and the like. These parts are also the major source of EMI. Optical embodiments of these parts are explained below.

Figure 4:
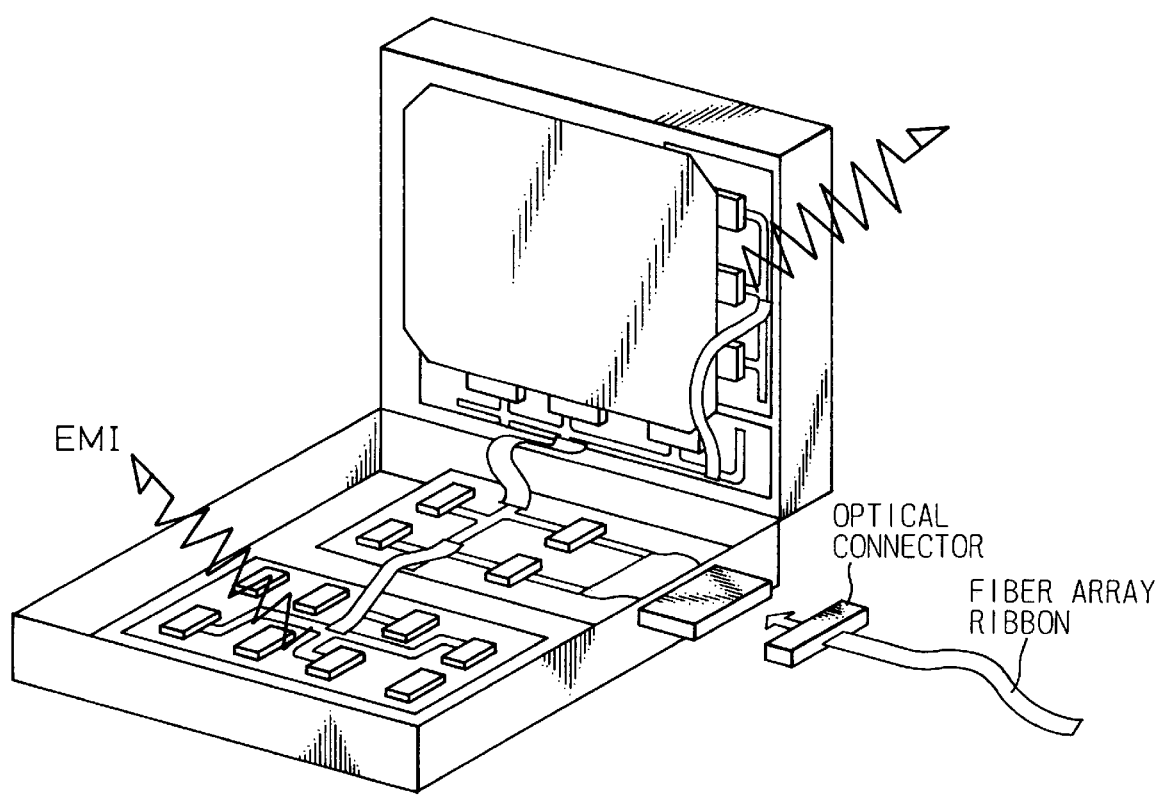
FIG. 4 is an illustration of an embodiment wherein printed circuit boards and an interface cable are optically wired with an active optical circuit sheet.

FIG. 4 is an illustration of an embodiment wherein printed circuit boards and an interface cable are optically wired with a flexible active optical circuit sheet. This results in reduction in EMI. It also minimizes clock and data waveform corruption or degradation, and sometimes also the power required for signal transmission. The detailed structure of the active optical circuit sheet used here will be explained later, but this embodiment is constructed so as to allow optical connection of active optical circuit sheet pads to prescribed signal transmitting sections and receiving sections of the printed circuit board by simple establishment of electrical contacts. The signal transmitting and receiving sections do not necessarily require special pads, and the contacts may be established with normal wiring. In the case of optical interface cables, the edges of the optical circuit sheet become the optical connectors, as shown in the drawing.

Figure 5:
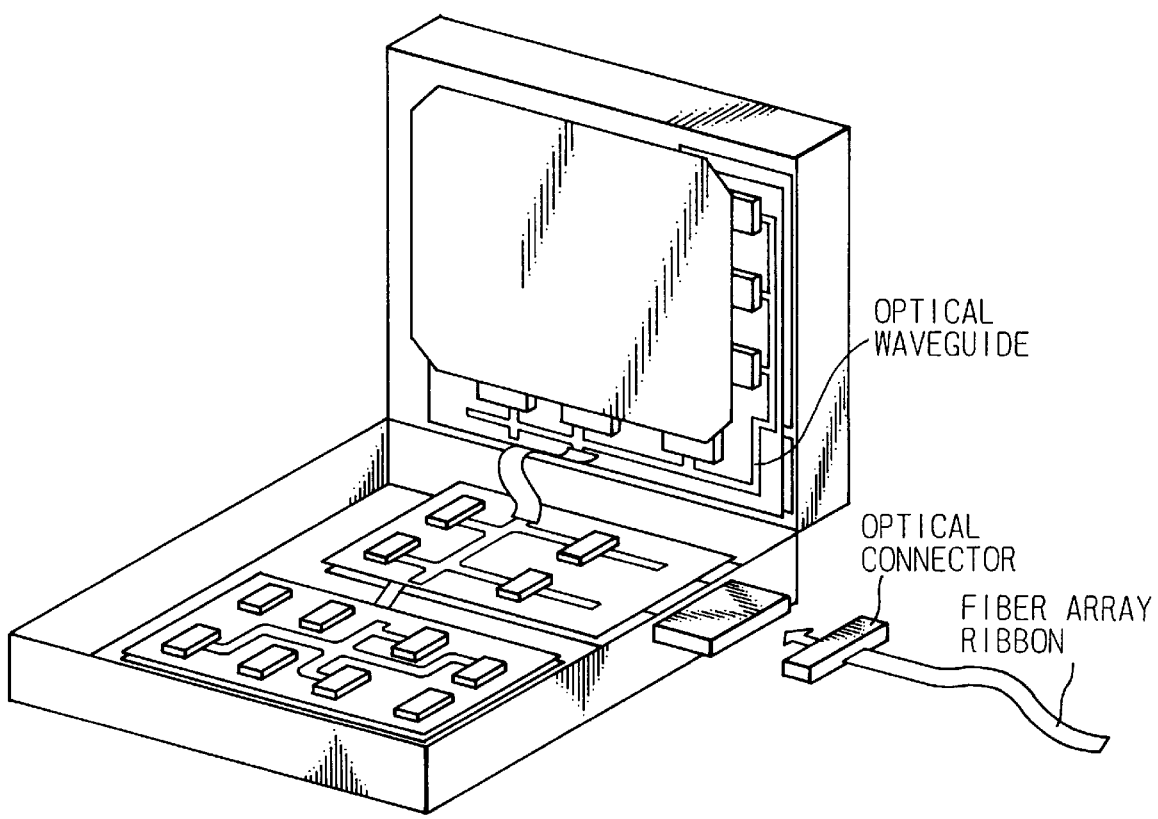
FIG. 5 is an illustration of an embodiment wherein an active optical circuit sheet is mounted on a printed circuit board.

FIG. 5 is an illustration of an embodiment wherein an active optical circuit sheet is mounted on a printed circuit board. Here, clock lines and other wiring for long distance transmission of high-speed pulses, are replaced with optical wiring. This results in reduction in EMI. It also minimizes clock and data waveform corruption, and sometimes also the power required for signal transmission. The active optical circuit sheet may be flexible, or it may be a flat active optical circuit board. These contain holes in order to avoid mounting parts on the printed board. In the case of a flexible sheet, each of the mounting parts may be covered.

FIGS. 6 through 9 show embodiments of active optical circuit sheets or boards. FIGS. 10 and 11 show embodiments of their detailed structure. FIG. 12 is an illustration of an embodiment showing the connection structure between an active optical circuit sheet or board and a printed circuit board.

Figure 10A:
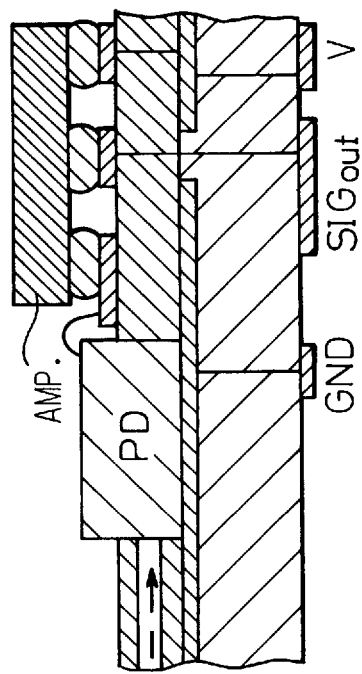
FIGS. 10(a), 10(b), 10(c) and 10(d) are illustrations of embodiments showing the detailed structure of active optical circuit sheets or boards.
Figure 10B:
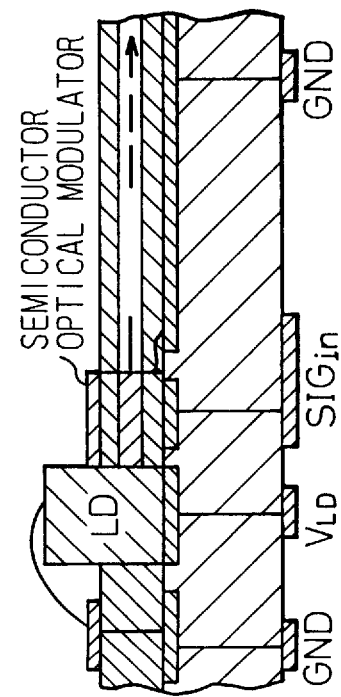
Figure 10C:
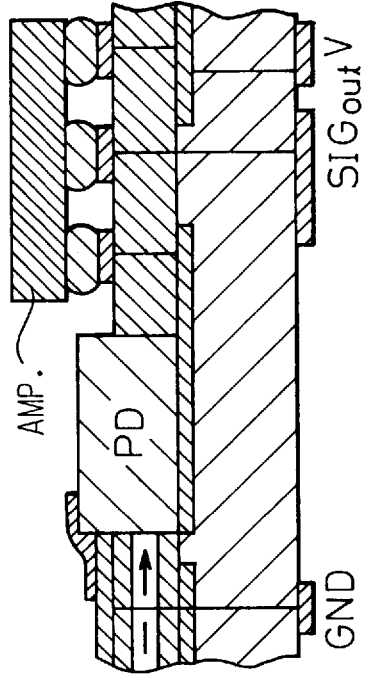
Figure 10D:
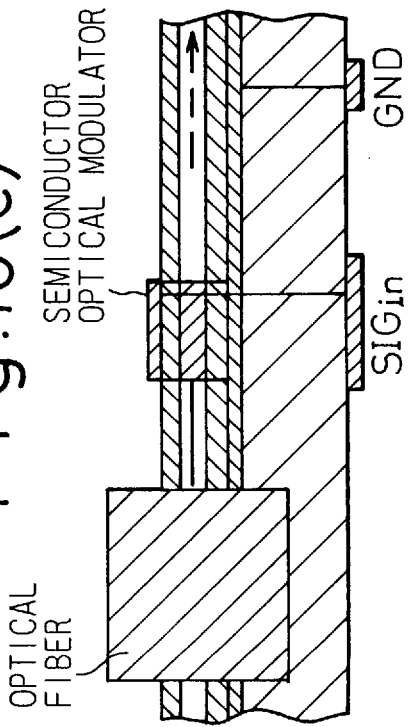

FIG. 10(a) is an embodiment of an optical transmitter on which is mounted an LD-semiconductor EA (Electro-Absorption) optical modulator integrated device. The optical modulator is coupled with a waveguide. The LD emits light from DC by a constant current flowing from a VLD pad. The DC light is switched on/off by the EA modulator in response to voltage from a SIGin pad, for transmission of optical signals. The modulator is not limited to being an EA modulator, and devices utilizing non-linear optical effects may also be used. FIG. 10(c) is an embodiment wherein an external DC light source is introduced to the waveguide from optical fibers, and modulated by a semiconductor optical modulator. In this case, since heat generated by the LD does not affect the active optical circuit sheet or board, thermal management is facilitated. FIGS. 10(b) and 10(d) are embodiments of PDs mounted on optical receivers. Optical signals transmitted through the waveguide are received at the PD, and then outputted to the SIGout after amplification by an amp. A biasing voltage is not necessary for the PD if this is a solar battery type, but must be supplied in other cases, though it is omitted in the drawing. PDs which may be used include waveguide types and small-capacity MSM devices. Sufficiently strong light power will render the amplifier unnecessary, to allow further simplification.

Figure 11A:
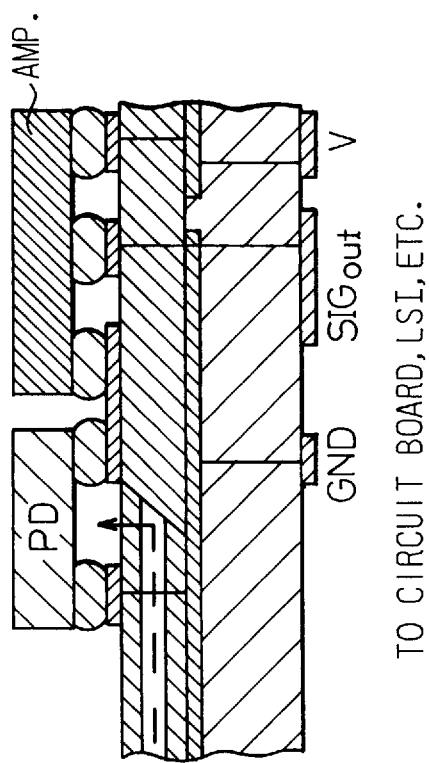
FIGS. 11(a), 11(b), 11(c) and 11(d) are illustrations of other embodiments showing the detailed structure of active optical circuit sheets or boards.
Figure 11B:
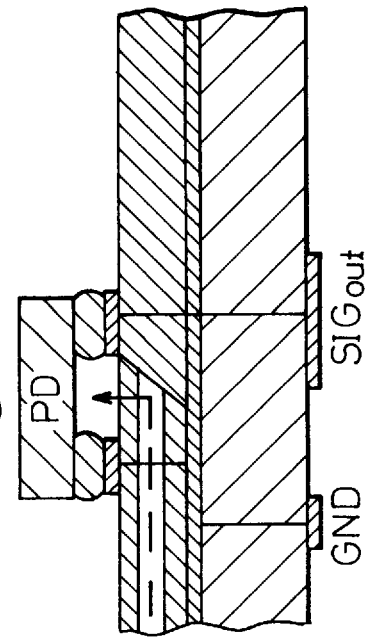
Figure 11C:
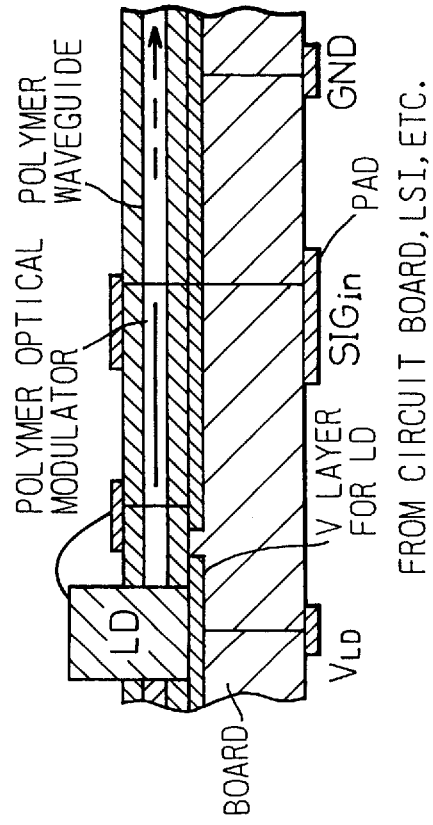
Figure 11D:
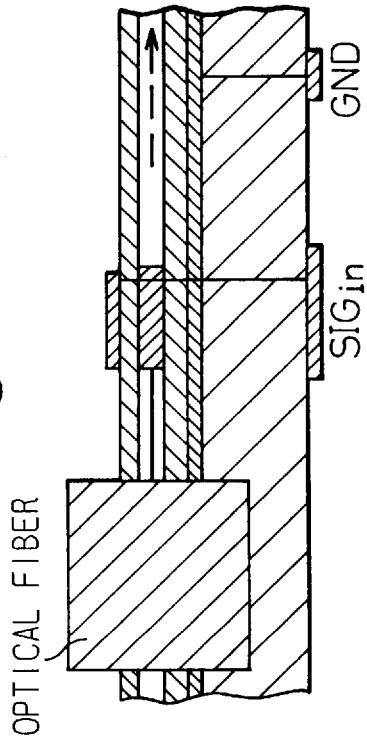
Figure 12:
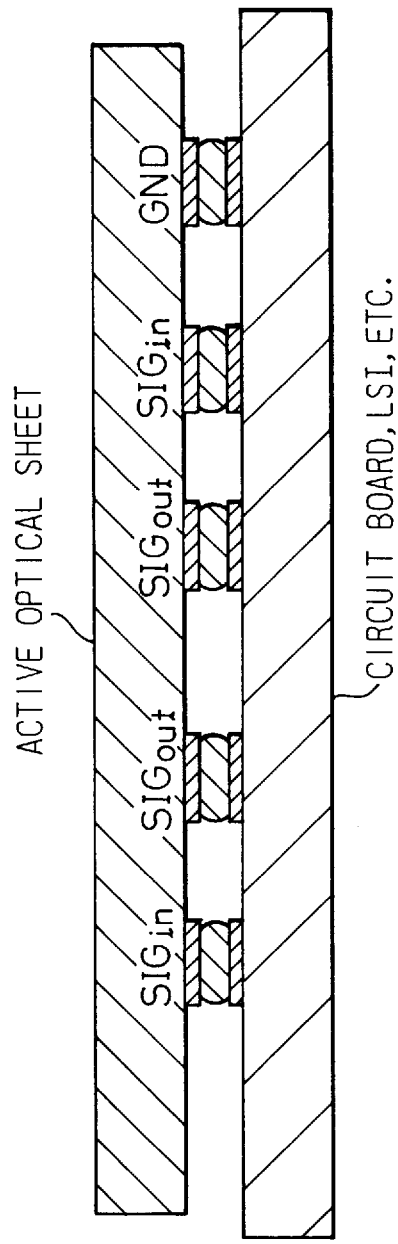
FIG. 12 is an illustration of an embodiment showing the connection structure between an active optical circuit sheet or board and a printed circuit board.

FIGS. 11(a) and (c) are embodiments utilizing polymer optical modulators. The transmission principle for these cases is the same as in FIGS. 10(a) and (c). A polymer optical modulator is more easily coupled with the waveguide because it can be incorporated monolithically into the board. In addition, the lower dielectric constant is effective for high-speed and low-current driving. FIGS. 11(b) and (d) are embodiments with PDs mounted on the surface. These may be realized by forming mirrors on the waveguide section. FIG. 11(d) is an embodiment in which no amp is used, which is the most preferred embodiment. It is also possible to provide the GND electrode on the surface side and the modulator electrode on the internal layer side, or alternatively depending on the structure of the device, both electrodes may be formed on the same side.

FIG. 12 is an embodiment of connection between an active optical circuit sheet and a printed circuit board (applying also to large-surface-area LSIs, etc.). Solder bumps may be used for the connections, but they sometimes result in defects in the active optical circuit sheet. Still, electrical connections may be easily established using a conductive adhesive or crimp contacts. In the embodiments in FIGS. 10(a)–10(d) and 11(a)–11(d), SIGin and SIGout pads are provided on the back side. When these are provided on the surface, the mounted parts become obstacles, thus severely limiting the direction of mounting. Therefore, the positioning freedom on the printing board may be increased by providing them on the back side. The connections may be located anywhere on the printed board which carries a voltage, such as on the electrode wiring, in addition to the pads and terminals. This allows the voltage signal to be probed at any desired point, for conversion to an optical signal. Such a feature has never been possible with voltage-driven external modulator systems. Furthermore, alignment of the connections may be facilitated by increasing the size of the SIGin and SIGout pads. Wider bands usually require drastically reduced electrode areas for optical modulators and optical switches. The volume of the pads has been a problem when electrodes of conventional optical modulators and optical switches are on the same side as the connection pads, but since according to the invention the pads are placed on the back side, the pad volume is reduced. Consequently, even if the pad area is made larger than the electrode area of the optical modulator or optical switch, the effect on the band decrease is minimal. Furthermore, by spreading a solid GND or Vcc, a shielding effect may be obtained.

FIG. 6(a) shows an embodiment wherein light is introduced externally through fibers, branched at a waveguide, transmitted by an optical modulator array, and received by a PD array. This active optical circuit sheet or board is mainly used for flexible optical connection between printed circuit boards and the like. FIG. 6(b) shows an embodiment wherein light is branched at the LD, and electrical signals at prescribed locations on the printed circuit board are converted to optical signals, transmitted, and received at the PD array. This sheet or board is suitable for internal wiring of a printed circuit board or for wiring between printed wiring boards.

FIGS. 7(a) and 7(b) are embodiments wherein light is first modulated by a modulator at the base and then distributed, and these are suitable for clock distribution.

Figure 8A:
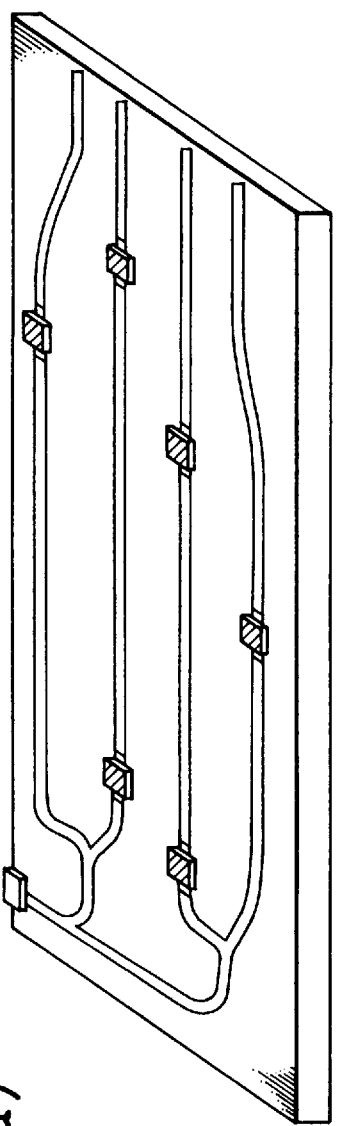
FIGS. 8(a) and 8(b) are illustrations of transmitter sections of active optical circuit sheets or boards.
Figure 8B:
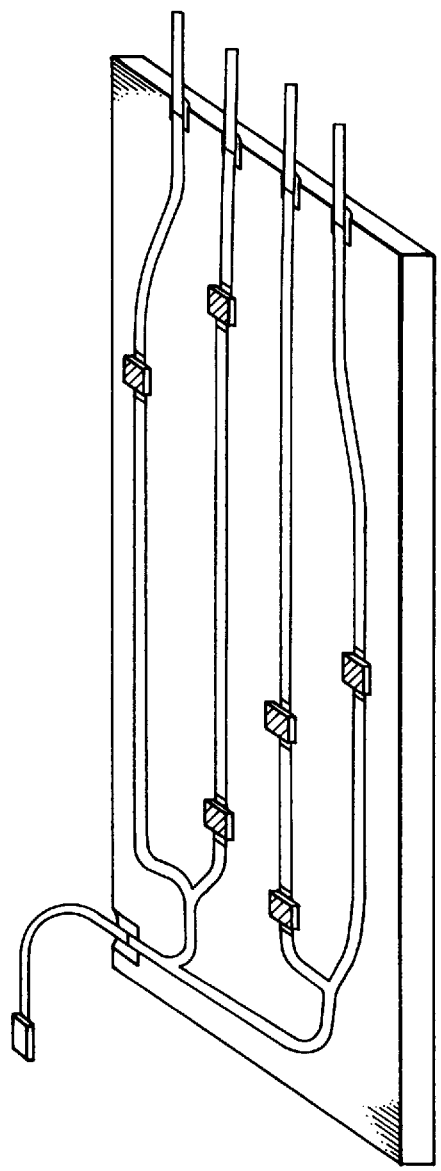
Figure 9A:
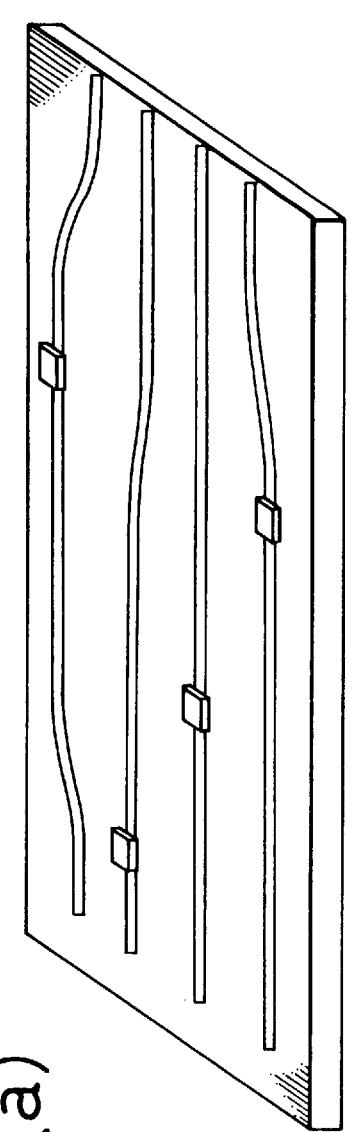
FIGS. 9(a) and 9(b) are illustrations of receiver sections of active optical circuit sheets or boards.
Figure 9B:
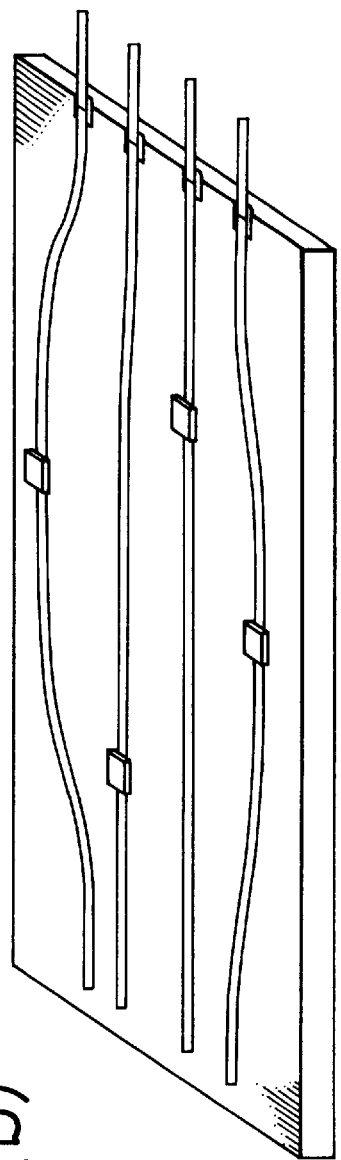

FIG. 8 is an embodiment of a transmitter wherein electrical signals at prescribed locations on the printed circuit board are converted to optical signals, transmitted, and outputted to an external fiber cable. Also, FIG. 9 is an embodiment of a receiver wherein the optical signals from an external fiber cable are converted to electrical signals at prescribed locations. These are based on the same concept as an optical wiring I/O adapter (Japanese Unexamined Patent Publication No. 63-229427), but with the novel aspect that the light is introduced into the interior of the printed board. This allows further shortening of the electrical wiring length.

Useful optical modulators and optical switches for the present invention include, for example, Mach-Zehnder types, directional coupling types, (full) reflective types, phase retardation types, electro-absorption types and digital optical switch types. Useful nonlinear optical materials include electrooptical polymers, conjugated polymers, nonlinear optical glass, semiconductors, and the like. Waveguide materials include polymers and glass. The entire waveguide need not be made of a nonlinear optical material, as only the switch portion may be made nonlinearly optical. In such cases, a passive waveguide made of fluorinated polyimide or glass may be used. The board may be glass, a Si wafer or a polymer. Polymer materials are particularly preferred when flexibility is a requirement. The thickness of the board is suitably on the order of 10–1000 $\mu$m, and typical examples of materials are polyimide, epoxy, silicone and acrylic polymers. Standard PDs are made of Si or compound semiconductors. Other promising possibilities include photodiodes, phototransistors and MSM detectors made of a-Si, poly-Si and conjugated polymers, which allow monolithic coupling with the board. The receiving element may be formed at the upper end or lower end of the waveguide, or midway through the waveguide, to absorb light from the waveguide. The PD may also be formed on an LSI board or printed circuit board to receive light.

The preceding explanation concerns embodiments of printed circuit boards (IC boards), but it may be applied in the same manner to other electronic devices (MCMs, back planes, LSIs, personal computers, workstations, computers, their peripheral devices, terminals, etc.).

Furthermore, although the present invention has been explained mainly with respect to optical modulators, depending on the case light-emitting elements such as LDs, LEDs and ELs may be mounted instead of optical modulators. Driving LSIs will be necessary in such cases. A SIGin is inputted to a driving LSI to effect ON/OFF switching of the light-emitting element. Though more complicated than using an optical modulator, light transmission is still possible.

Figure 14A:
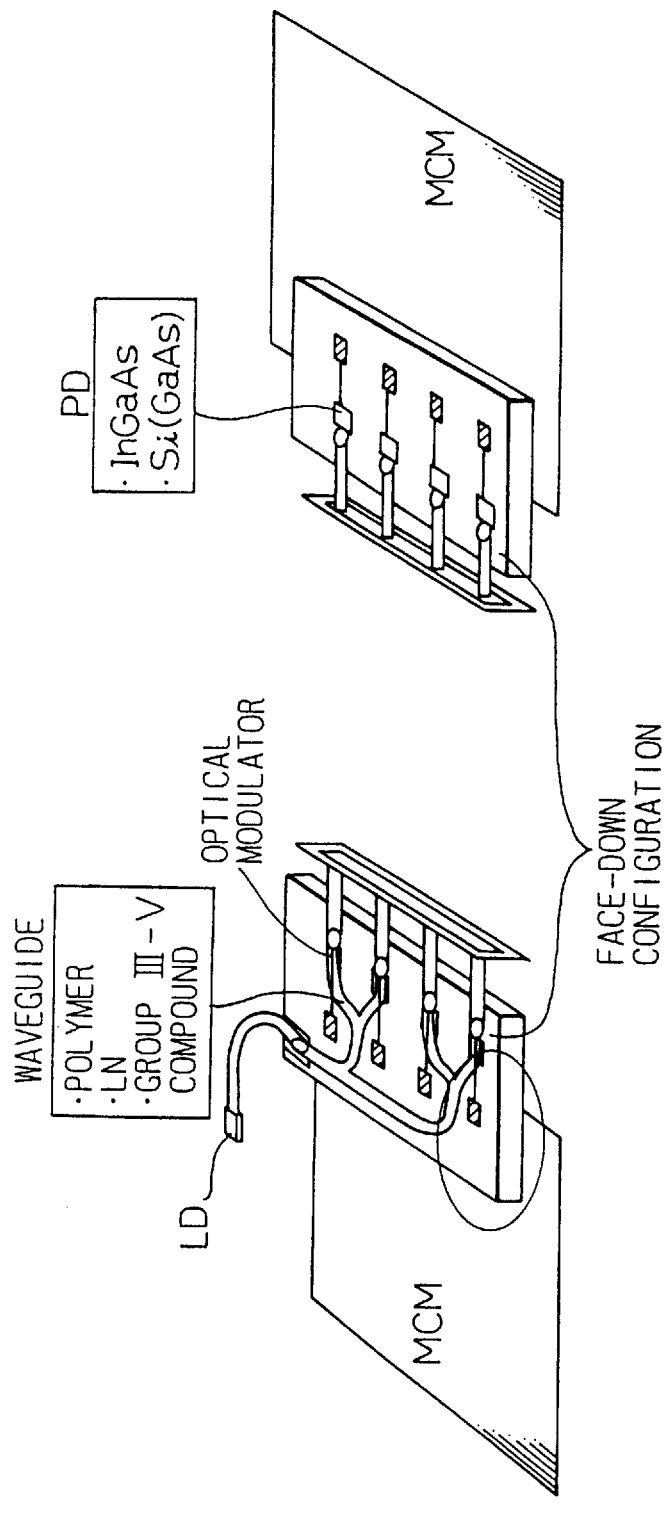
FIGS. 14(a) and 14(b) are schematic views of an embodiment of a bump junction between an optical modulator and an MCM terminal.
Figure 14B:
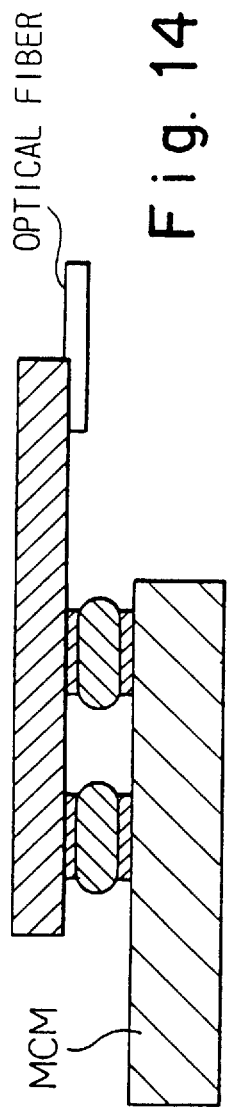

FIGS. 13(a)–13(c) are schematic views of an embodiment of an active optical connector for an optical parallel link module. LD light as CW light source is introduced from the side of the board, and then branched and guided to optical modulators. Each of the optical modulators is electrically connected to the output terminal of an electronic device (a processor element in this case) by, for example, an electrical connector or bump junction. Thus, optical signals corresponding to the electrical output are transmitted and sent to another processor element through, for example, an optical fiber. Since the light is supplied from the side, mounting is facilitated without obstruction by the light source. Mounting is also made easier in cases such as shown in FIGS. 14(a)–(b) for example, where the optical modulator and MCM terminal are connected by bump junctions. FIGS. 14(a) and 14(b) show an embodiment of both a waveguide and PD material.

FIGS. 15(a) to 15(c) are schematic views of an embodiment wherein LD light as CW light source is introduced from the surface of the board (i.e. the direction opposite to that of light transmission) and is branched and guided to an optical modulator. Mounting is facilitated in this case as well.

Figure 16A:
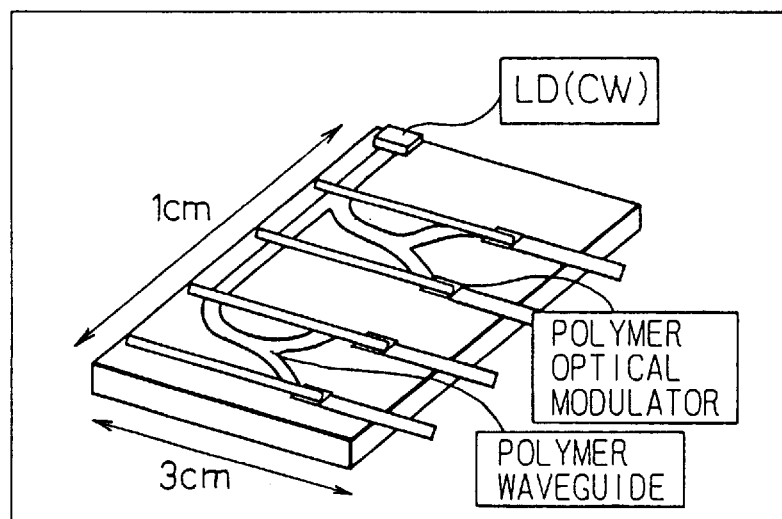
FIGS. 16(a) and 16(b) and are schematic views of an applied embodiment of light transmission between computers with an active optical connector.
Figure 16B:
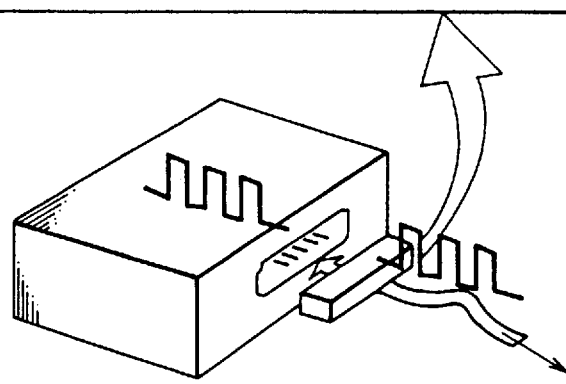
Figure 17A:
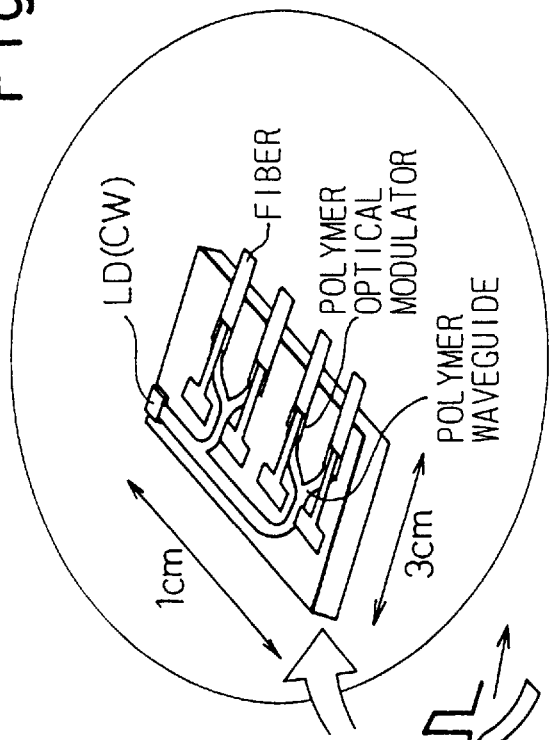
FIGS. 17(a) and 17(b) are schematic views of an applied embodiment of an active optical connector for a personal computer.
Figure 17B:
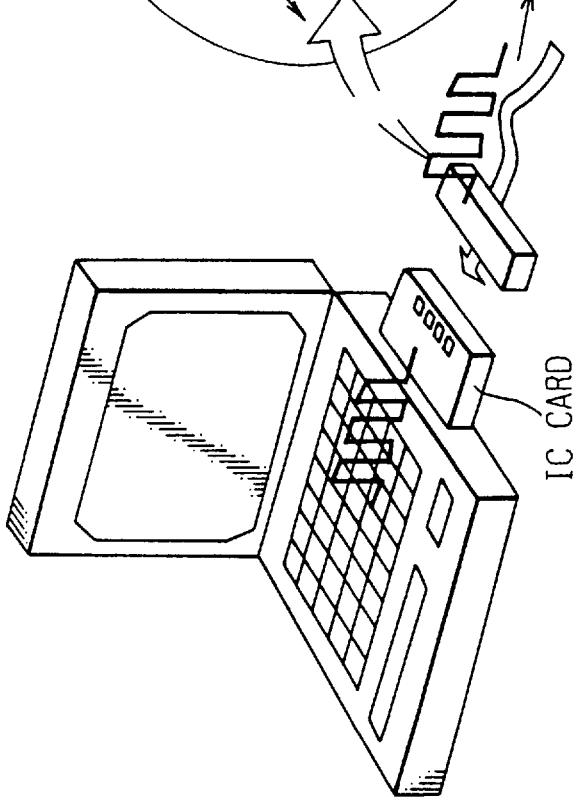

FIGS. 16(a) and 16(b) are schematic views of an applied embodiment of light transmission between computers with a polymer active optical connector such as shown in FIGS. 13(a)–(c) or 14(a)–(b). FIGS. 17(a) and (b) show an applied embodiment of an active optical connector for a personal computer. The output from an IC card is converted to light for easier transmission. FIGS. 18(a)–18(c) are schematic views of an embodiment of an optical MCM/back plane. As mentioned above, an active optical connector is used for optical wiring inside the MCM or optical wiring to the outside of the MCM. For light transmission to the outside, it is effective from the standpoint of the mounting layout to direct the incident light at a nearly normal angle to the direction of light transmission.

FIG. 19 shows concrete embodiments of materials for optical MCMs and active optical connectors. The optical modulator used here may be an electrooptical polymer device, optosemiconductor device, LN (lithium niobate), or the like. The waveguide may be made of polymer or glass, but a optosemiconductor or LN may also be used. The amp is optional. FIG. 19(a) is an optically attached embodiment, and FIG. 19(b) is an electrically attached embodiment, both of which may have the construction described above.

Figure 20:
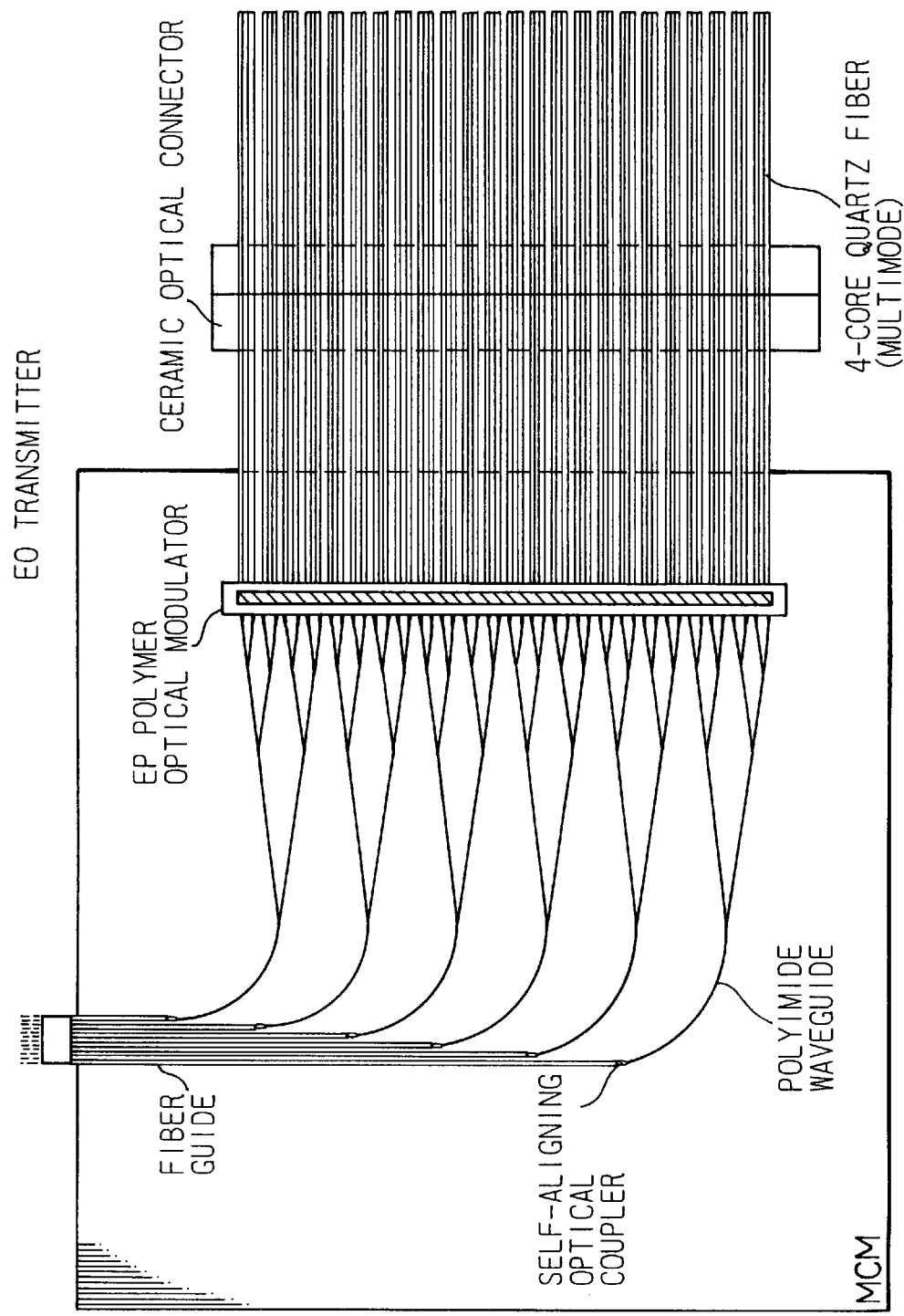
FIG. 20 is a schematic drawing showing the detailed structure of the EO transmitter section of the apparatus in FIG. 19.
Figure 22A:
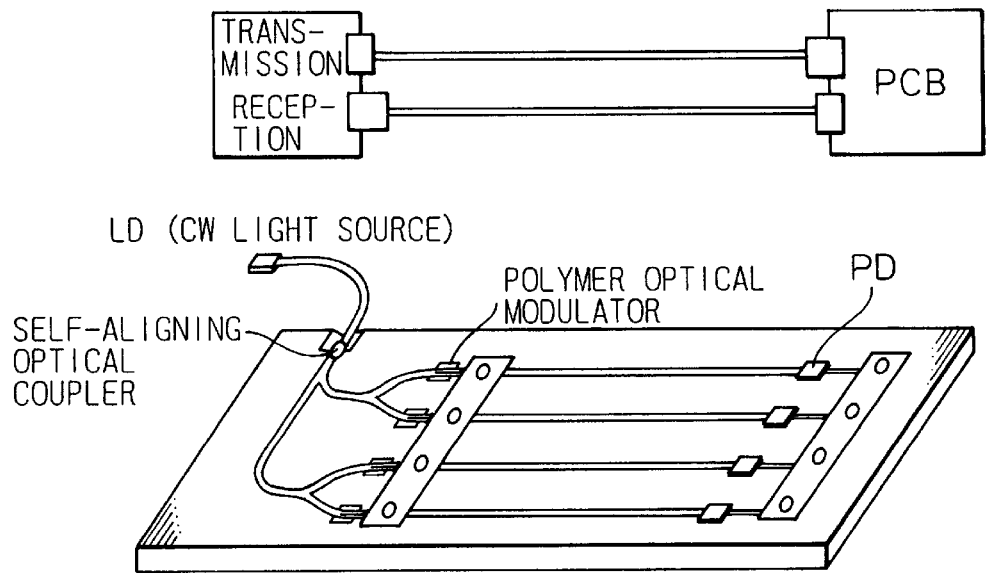
FIGS. 22(a) and 22(b) are schematic views of embodiments of optical parallel back planes.
Figure 22B:
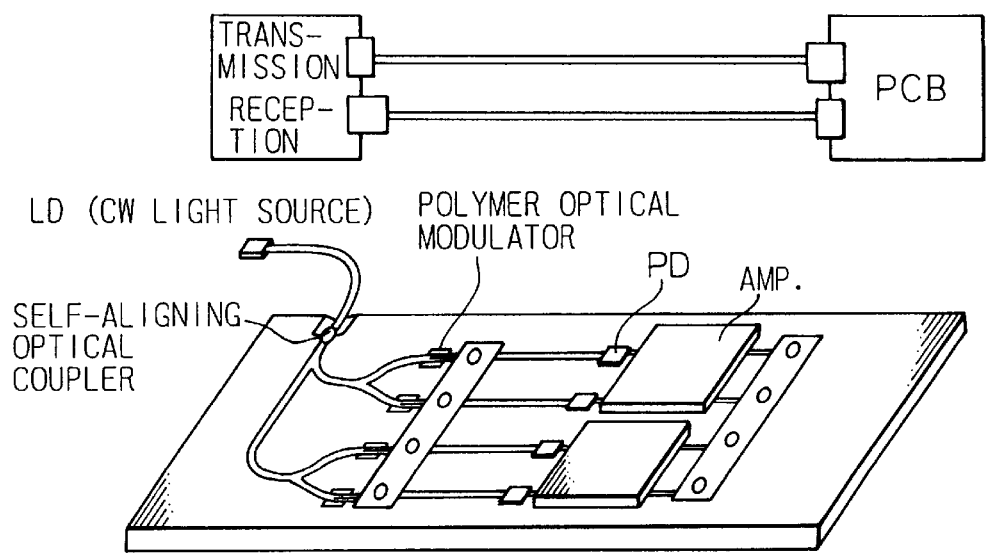

FIG. 20 is a schematic drawing showing the detailed structure of the EO transmitter section of the optically attached type mentioned above. Incident light from the optical fibers is branched at polymer waveguides, and then modulated at an integrated electrooptical polymer optical modulator. The electrodes and pads have been omitted here. LDs may also be mounted instead of the optical fibers. FIGS. 21(a) and (b), on the other hand, are schematic drawings showing the detailed structure of the receiver section. Optical signals from an active optical connector such as shown in FIG. 20 are electrically converted by a PD or MSM detector. The amp is not necessary if the optical power is on the order of 1 mW, but in cases of low optical power an amp is essential. FIG. 22 shows embodiments of optical parallel back planes. In these cases, the optical wiring is completed simply by setting the printed circuit board (PCB). FIG. 22(a) is a case without an amp, and FIG. 22(b) is a case with a built-in amp.

Figure 23:
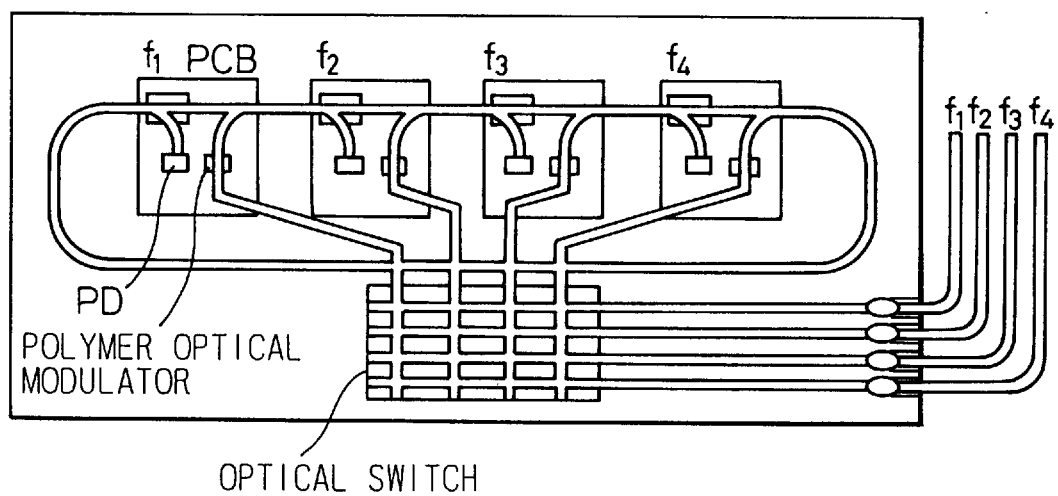
FIG. 23 is a schematic drawing of an embodiment of an optical MCM or optical back plane employing wavelength multiplex transmission.

FIG. 23 illustrates an embodiment of an optical MCM or optical back plane employing wavelength multiplex transmission. For example, light from f1, f2, f3 and f4 is introduced into waveguides and switched with a matrix optical switch (or optical filter). Assuming that wavelengths f1, f2, f3 and f4 have been assigned to PCBs 1, 2, 3 and 4, then when transmission from PCB1→PCB3, PCB2→PCB4, PCB3→PCB1 and PCB4→PCB2 is necessary, switching is accomplished to send f3 to PCB1, f4 to PCB2, f1 to PCB3 and f2 to PCB4. This allows simplification of the light source, improvement in wavelength stability and reduced LD cost and mounting costs.

FIG. 24 shows schematic views of some embodiments of fiber optical connectors. FIG. 24(a) illustrates an example of LD/multimode fibers. A photorefractive index material is placed in all or part of the section between the LD/fibers, and light is irradiated from the fibers or LD, or both, to create a refractive index distribution in the photorefractive index material, forming an optical coupling path. The writing conditions are such that when writing from the LD a widened refractive index distribution is formed, and when writing from the fibers a refractive index distribution is formed by self-focusing. Writing is also possible from both ends with a SOLNET system (self-organized light waveguide network; see Japanese Patent Application No. 6-140502). Here, the photorefractive index material is adhered to either the LD end or the fiber end, or both, allowing easy detachment by leaving an area between them, etc. The same applies if the fibers are single-mode fibers. Furthermore, there is no correlation between the area left open and the reading end, and the two devices may be placed opposing each other as shown at the top row, with the writing accomplished from the fiber end (although the example in the top row is a case of writing from the LD end). With this orientation, writing from the fiber end forms a distribution such as, for example, shown in the middle row, even when the fibers and the photorefractive index material are apart. FIG. 24(b) shows an example of coupling between multimode fibers. The top row is a case of writing which employs self-focusing from the left, the middle row is a case of writing a widening refractive index distribution from the right (pulse writing), and the bottom row is a case where both of these are performed. In the case of the bottom row, the oriented photorefractive index material may be exposed at separate locations by both fibers. These methods provide reduction in modal noise with respect to light transmission from left to right. FIG. 24(c) shows fiber/PD coupling, wherein writing from the fibers is accomplished utilizing self-focusing.

Figure 25:
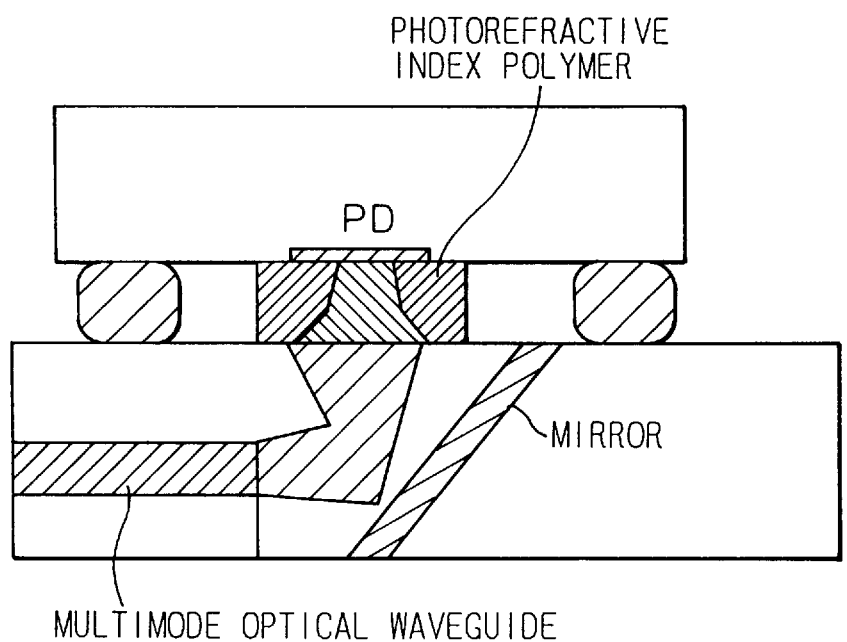
FIG. 25 is a schematic drawing of another embodiment of an optical waveguide and PD coupling.
Figure 29A:
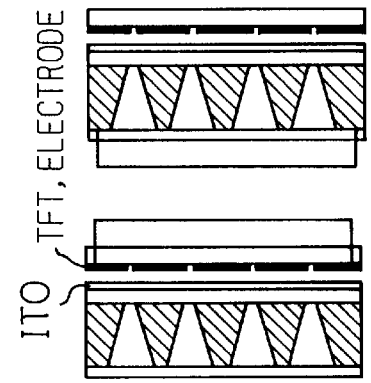
FIGS. 29(a), 29(b), 29(c) and 29(d) are schematic drawings of embodiments of LCD displays wherein a refractive index distribution is formed in a photorefractive index material positioned on a TFT-formed board or a board facing it in a TFT-driven liquid crystal display.
Figure 29B:
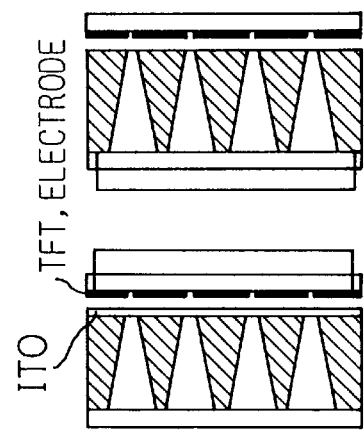
Figure 29C:
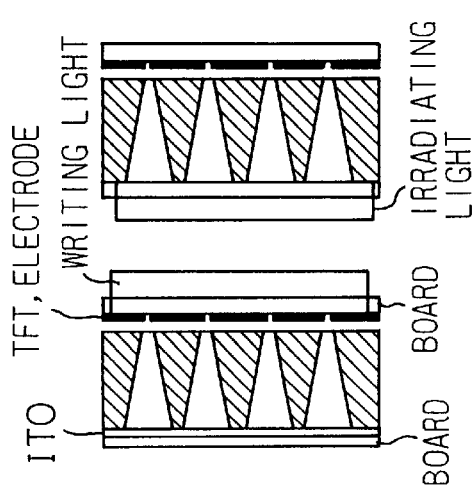
Figure 29D:
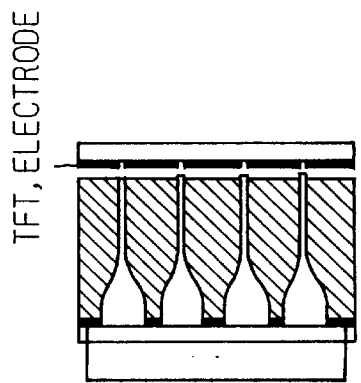

As shown in FIG. 25, a mirror may be placed in the optical path, and the connector formed in the normal direction. Emission from the waveguide board writes a refractive index distribution into the photorefractive index polymer. In this drawing the emission from the board is tightened for strong self-focusing, but a weaker self-focusing effect may be used to guide the wave with roughly the same widening or to guide the wave while widening it.

The photorefractive index material used according to the invention may be a photopolymer prepared, for example, by adding a high refractive index carbazole to an acrylic binder or epoxy binder (polymer, oligomer or monomer), and further adding a sensitizing agent, polymerization initiator or the like. Such materials have an increased refractive index at light-irradiated portions. The sensitivity is normally between 400 and 700 nm. The written refractive index distribution may be fixed by heat, light irradiation, etc. It is also possible to reinforce the degree of cure and stability by UV irradiation or heat treatment. This of course in no way limits the material and other materials, such as polymer or glass, may be used so long as the refractive index varies with light irradiation. A sensitizing agent may also be added for long wavelength sensitization. As an example of LD light-absorbing substances there may be mentioned diphthalocyanine, polymethine, Kyasorb, IR-750, IRG-002, IRG-003, IR-820, IRG-022, IRG-023:CY-2, CY-4, CY-9 and CY20 (all trademarks of Nihon Kayaku, KK.).

FIGS. 26(a)–26(f) are schematic views of embodiments of various optical connectors. These are formed with a two-end writing SOLNET system (one-end writing for fiber/PD coupling). Here, the photorefractive index material stands apart from both devices. In this case, the material may be formed into a plate and inserted between the devices. These embodiments may also be constructed so that the photorefractive index material is adhered to the devices, as shown in FIG. 24.

FIG. 27(a)–27(e) illustrate an embodiment of the detailed structure of the connector section between multimode fibers.

The device used is not limited to the one described above, and may be, for example, an optical waveguide, light-emitting diode, EL element, spatial optical modulator element, lens, hologram, prism, grating, mirror, pinhole, slit or filter.

FIG. 28 shows schematic views of embodiments employing optical waveguides obtained by directing spatial propagated light, waveguide light or radiated light incident to a photorefractive index material to form a refractive index distribution while producing a self-focusing effect. FIG. 28(a) is an embodiment wherein spatial propagated light, waveguide light or radiated light incident is directed incident to a photorefractive index material, and the beam is tightened by a self-focusing effect. FIG. 28(b) is an embodiment wherein a beam pattern is formed with a mask. FIG. 28(c) is an embodiment wherein an array of spatial beams are tightened. FIG. 28(d) is an embodiment wherein the diameter of the beam varies in the axial direction, and when the beam is not circular, a self-focusing effect is used to approximate a circular beam. For example, even if the beam diameter differs lengthwise and widthwise, the self-focusing effect may be used to approximate an equal diameter. FIG. 28(e) is an embodiment wherein light from a fiber array is tightened by a self-focusing effect and converged on PDs. It is thus possible to realize optical wiring by placing a photorefractive index material either in contact with or spaced from a device which is not limited to optical fibers but may also be selected from among optical waveguides, semiconductor lasers, light-emitting diodes, EL elements, spatial optical modulator elements, lenses, holograms, prisms, gratings, mirrors, pinholes, slits, filters, and arrays thereof, directing their emitted light to form a refractive index distribution while producing a self-focusing effect, and forming the terminal thereof by connection to or spacing from a photodiode array. FIG. 28(f) is an embodiment wherein light radiated from an EL or LD is converged. FIG. 28(g) is an embodiment of an optical printer wherein light from an EL element, LED (light-emitting diode), LC light bulb (spatial optical modulator element) or the like is converged and irradiated onto a photosensitive drum. The emitting light source is not limited to these, and may be selected from among optical fibers, optical waveguides, semiconductor lasers, lenses, holograms, prisms, gratings, mirrors, pinholes, slits, filters, and arrays thereof. The optical printer may be realized by placing a photorefractive index material either in contact with or spaced from the device, directing emitted light from the device, while producing a self-focusing effect, to form a waveguide with a smaller or equal diameter as the incident end, and forming the terminal thereof by connection to or spacing from a photosensitive drum or photosensor. FIG. 28(h) is an embodiment of an apparatus wherein light from an EL element or LED is converged, and first guided to a document surface, after which the reflected light is guided to a PD, for image reading. Instead of light from an EL element or LED, a device selected from among optical fibers, optical waveguides, semiconductor lasers, spatial optical modulator elements, lenses, holograms, prisms, gratings, mirrors, pinholes, slits, filters, and arrays thereof, may also be used. It is thus possible to realize an image reading device formed by placing a photorefractive index material either in contact with or spaced from the device, directing emitted light from the device, while producing a self-focusing effect, and reflecting the light with a light reflector positioned near the edge, to form a bent waveguide with a smaller or equal diameter as the incident end, and forming the terminal thereof by connection to or spacing from a photodiode PD. This may be produced, for example, by placing the document on the mirror first and then exposing it to light.

In these embodiments, the wavelengths of the writing light and the light actually used may be the same or different.

The self-focusing effect makes possible a refractive index distribution with a smaller widening than the widening of the original light beam, and allows the waveguide to be formed with a smaller or equal diameter as the incident end, for effective focusing of the light.

The light may be spatial propagated light, waveguide light from an optical fiber, optical waveguide or semiconductor laser, or radiated light from a device selected from light-emitting diodes, EL elements, spatial optical modulator elements, lenses, holograms, prisms, gratings, mirrors, pinholes, slits and filters. Alternatively, a mirror, grating, hologram, prism, lens, waveguide, pinhole, slit or filter may be positioned over all or at least part of the region through which the light passes.

FIG. 29 is a schematic view of an embodiment wherein a photorefractive index material is positioned on a TFT-formed board or a board facing it in a TFT-driven liquid crystal display, light is irradiated from the side of the board on which the TFT is formed, and a refractive index distribution is formed in the photorefractive index material by light passing through an opening, to achieve effective use of light from a backlight or the like. These drawings omit the details of the oriented film. FIG. 29(a) is an embodiment wherein the photorefractive index material is positioned on the side of the opposing board on which the electrode is formed, and the writing light is irradiated from the TFT board side. The writing light passing through the opening forms a widened distribution in this case. As a result, a self-aligned converging path is formed in the opening, providing an increase in the panel brightness. FIGS. 29(b) and (c) are embodiments wherein the electrodes are formed after forming the photorefractive index layer. This allows more efficient use of the light without losing voltage efficiency to the liquid crystal layer. FIG. 29(d) is an embodiment wherein a converging path is formed by self-focusing from the opposing board side. In this case, writing light is also directed from the TFT board side, to effectively accomplish self-alignment in the openings in a SOLNET system.

Figure 30:
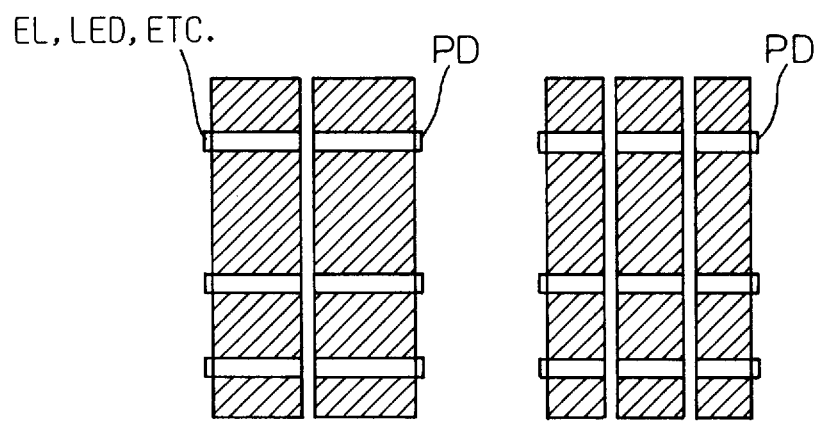
FIG. 30 is a schematic view of an embodiment of an optical key.

FIG. 30 is an embodiment of an optical key. An EL, LED or the like is placed facing a PD or other receiver element in a prescribed orientation, and the optical path is written with light emitted from the light-emitting source. If one or more breaks are provided midway, with different break units, and light from the light source is directed onto all of the optical paths when they are later readjusted, then it is possible to determine whether each has the same setting. This may therefore be used as an identifiable key. It is not absolutely necessary for all of the units to be different, and they may be in a fixed block, for application in a variety of security management or pattern recognition devices. The light source may also be selected from among optical fibers, optical waveguides, semiconductor lasers, spatial optical modulator elements, lenses, holograms, prisms, gratings, mirrors, pinholes, slits, filters, and arrays thereof. It is thus possible to realize an optical key by forming a photorefractive index material either connected to or spaced from the light source, and directing the emitted light incident thereto while producing a self-focusing effect, to form a waveguide with a smaller or equal diameter as the incident end, and forming the terminal thereof by connection to or spacing from a photodiode array, with at least one break being provided along the optical wiring. The waveguide may also have the breaks formed in advance and joined together.

Figure 32:
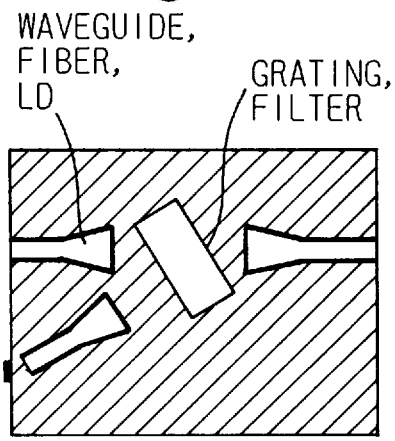
FIG. 32 is a schematic view of an embodiment of a branching optical circuit.

FIG. 31(a) is a schematic view illustrating a process for forming markers, wherein a photorefractive index material is formed on a region including an edge of a formed waveguide, and a marker is formed by light emitted from the waveguide. This allows precise positioning of the emission core, and facilitates subsequent processes. FIG. 31(b) is a schematic view illustrating an embodiment of a process for fabricating an optical circuit device, wherein one or a plurality of optical devices are formed or positioned, before, during or after which other optical devices are formed along the optical path between them, before, during or after which a photorefractive index material is positioned and light is emitted from at least one of the optical devices to form a waveguide. Here, after the waveguide, etc. has been formed, the filter and the photorefractive index material which fills the area between them are positioned, after which a waveguide is formed from one end, or preferably both ends, of the waveguide by a SOLNET system. This allows insertion of the optical device into the optical circuit to be accomplished without the laborious conventional processes of cutting the waveguide and inserting the filter thereafter. An additional merit is that gaps between the filter and waveguide may be eliminated, and the filter may be fixed without modification. The case shown in FIG. 31(c) is similar, except that the light receiving structure has a branching PD. FIG. 32 illustrates an embodiment of a branched optical circuit. The optical devices for these embodiments are not limited to those mentioned above.

Figure 33A:
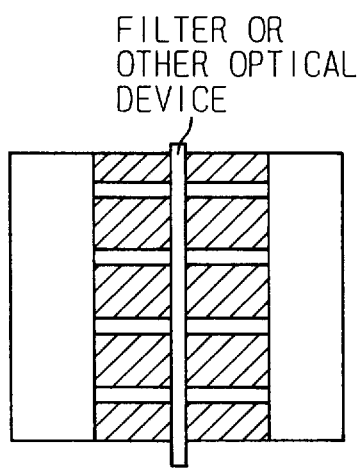
FIGS. 33(a) and 33(b) are schematic view illustrating a process for fabricating a wavelength control device.
Figure 33B:
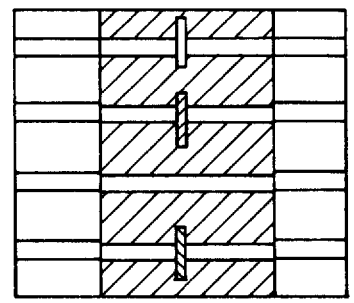

Furthermore, as shown in FIG. 33(a), a wavelength control device with waveguides on both sides (waveguide array) may be formed by positioning a photorefractive index material at both ends of, for example, a band pass filter, and irradiating a light beam thereon. Here, if the band pass filter is two-dimensional, a spatial device is formed, and if it is one-dimensional an array device or waveguide device is formed. A waveguide may also be formed by positioning a photorefractive index material between fibers or between waveguides (between a fiber array or between a waveguide array) at both ends of a band pass filter, and emitting writing light from both ends thereof. Here, the fibers or waveguides (fiber array or waveguide array) and the photorefractive index material may either be contacting or non-contacting. Conversely, the photorefractive index material may be positioned at opposite the ends of the fibers or waveguides (fiber array or waveguide array), and light writing accomplished either after or before inserting the band pass filter. The entire device may also be integrated. In FIG. 33(b) a plurality of devices are positioned between the fibers or waveguides. Such a device may be, for example, a band pass filter for different wavelengths.

As explained above, the present invention provides the following effects.

A. Formation of an active optical circuit sheet independent of the circuit board allows optical wiring to be introduced without complicating the production process for the circuit board.

B. Formation of an active optical circuit sheet independent of the circuit board allows optical wiring to be introduced without raising the cost.

C. Formation of SIGin and SIGout pads on the back side makes possible optical wiring without hindrance by parts mounted on the active optical circuit sheet, and therefore without restricting wiring freedom from and to any desired location on the printed circuit board. In addition, the electrode (or pad) area for contacting an optical circuit board with an electrical circuit board can be enlarged without reducing the board width.

D. Formation of an active optical circuit sheet independent of the circuit board minimizes the influence of the LSI soldering connection process, thus preventing damage to the active optical circuit sheet. E. Formation of SIGin and SIGout pads on the back side makes possible optical wiring without hindrance by parts mounted on the active optical circuit sheet, to thus allow realization of freer optical wiring which can be used both within and between electronic devices.

F. Provision of an optical EMI noise source and formation of a solid GND or solid Vcc on the active optical circuit sheet results in lower EMI.

G. In addition: Light is directed incident to the active optical connector or optical MCM at an angle which is not parallel to the optically transmitted output, to eliminate obstacles when mounting. Light is supplied from a unit at the optical signal receiving end, to eliminate obstacles when mounting. Switching is performed with a matrix optical switch or matrix optical filter to supply light of given wavelengths to optical modulators corresponding to given electronic devices, thus eliminating the need to position a variable wavelength light source or multiple light sources of different wavelengths, for each electronic device. This makes it possible to realize low-cost, down-sized active optical connectors and optical MCMs with lower power consumption, as well as reduced skewing (compared to LD arrays), a lower failure rate, easier array formation, improved wavelength stability and improved power stability.

H. The present invention also provides solutions to the problems described below.

(1) Known etching methods for forming waveguides have had low positioning precision and freedom of shape.

(2) Though positioning precision has been attempted with the V-groove method, adequate performance has not yet been realized.

(3) Optical connector loss and modal noise in multimode systems have been problems.

(4) Optical elements sometimes cannot be easily detached.

(5) Labor has been required for alignment of beams and lenses when employing lens arrays for adjusting waveguide beams and spatial beams for shape variation.

(6) There has been no method allowing easy reconstruction of light which varies in diameter in the axial direction (e.g. to approach a circle).

(7) There has been no method for automatically and readily forming the optical paths of optical wiring.

(8) With optical printers, there has been no method for automatically and readily forming optical paths guiding light to photosensitive drums.

(9) With image-reading devices, there has been no method for automatically and readily forming optical paths coupling the light sources, the objects to be read and the PDs.

(10) With TFT-driven liquid crystal displays, there has been no method for automatically guiding light to TFT openings.

(11) No keys have been provided which are recognized by waveguide orientation.

(12) There has been no method for forming a marker with light emitted from the waveguide end after formation of the waveguide.

(13) There has been no method for easily inserting optical devices midway through waveguides.

We claim:

1. An optical circuit board, comprising:

an optical modulator regulating generation of light from a light source in correspondence with a voltage from an electronic device, and pick-up or modulation of at least a portion of light from an optical waveguide to produce an optical signal;

a photoreceptor element converting the optical signal into an electrical signal transmitted to the electronic device;

a waveguide connected between said optical modulator and said photoreceptor element transmitting the optical signal from said optical modulator to said photoreceptor element; and an electrical connection formed between said optical circuit board and the electronic device, separating the electronic device from the optical circuit board at locations corresponding to said optical modulator and said photoreceptor element for providing the voltage from the electronic device to said optical modulator and for transferring the electrical signal output by said photoreceptor element to the electronic device.

2. An optical circuit board according to claim 1, wherein said electrical connection is provided by electrode pads disposed on an underside of the optical circuit board on which the optical circuit board is mounted for connection with the electronic device, the underside of the optical circuit board being opposite the side on which said optical modulator, said photoreceptor element, and said waveguide are disposed.

3. An optical circuit board, comprising:

a light-emitting device driven with a voltage from an electronic device to convert an electrical signal to an optical signal;

a photoreceptor element converting the optical signal into an electrical signal transmitted to the electronic device;

a waveguide connected between said light-emitting device and said photoreceptor element transmitting the optical signal from said light-emitting device to said photoreceptor element; and an electrical connection formed between said optical circuit board and the electronic device, separating the electronic device from the optical circuit board at locations corresponding to said light-emitting element and said photoreceptor element for providing the voltage from the electronic device to said optical modulator and for transferring the electrical signal output by said photoreceptor element to the electronic device.

4. An optical circuit board according to claim 3, wherein said electrical connection is provided by electrode pads disposed on an underside of the optical circuit board on which the optical circuit board is mounted for connection with the electronic device, the underside of the optical circuit board being opposite the side on which said optical modulator, said photoreceptor element, and said waveguide are disposed.

5. An optical circuit board according to claims 2 or 4, wherein the electrode pads on the optical circuit board are electrically connected to electrical wiring and terminals.

6. An optical circuit board according to claim 2, wherein an area of each of the electrode pads is wider than an area of an electrode directly in contact with the optical modulator.

7. An optical circuit board according to claims 1 or 3, wherein the optical circuit board is flexible.

8. An optical circuit board according to claims 1 or 2, wherein the optical modulator is integrated with the optical circuit board.

9. An optical circuit board according to claims 1 or 2, wherein the optical modulator is made of at least one of a nonlinear optical polymer and a compound semiconductor.

* * * * *